United States Patent
Ota et al.

(10) Patent No.: US 6,521,963 B1
(45) Date of Patent: Feb. 18, 2003

(54) SEMICONDUCTOR DEVICE AND METHOD OF MANUFACTURING SEMICONDUCTOR DEVICE

(75) Inventors: Kazunobu Ota, Tokyo (JP); Masashi Kitazawa, Tokyo (JP); Masayoshi Shirahata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/475,199

(22) Filed: Dec. 30, 1999

(30) Foreign Application Priority Data

Jul. 16, 1999 (JP) ............................. 11-203038

(51) Int. Cl.[7] .............................................. H01L 29/76
(52) U.S. Cl. ....................... 257/412; 257/413; 257/382; 257/383; 257/324; 257/350
(58) Field of Search ................................ 257/344, 408, 257/412, 413, 900; 438/184, 230, 265, 279, 299, 303, 304, 592, 595, 651, 652

(56) References Cited

U.S. PATENT DOCUMENTS 5,132,756 A * 7/1992 Matsuda ..................... 357/23.1
5,736,455 A 4/1998 Iyer et al.
5,907,188 A * 5/1999 Nakajima et al. ............ 257/751
6,030,876 A * 2/2000 Koike ........................ 438/303

FOREIGN PATENT DOCUMENTS

JP 7-202189 8/1995
JP 7-335885 12/1995

* cited by examiner

Primary Examiner—Olik Chaudhuri
Assistant Examiner—Wai-Sing Louie
(74) Attorney, Agent, or Firm—Oblon, Spivak, McClelland, Maier & Neustadt, P.C.

(57) ABSTRACT

A gate electrode (GE1) includes a polysilicon layer (4C), silicon oxide films (reoxidation films) 14, a metal layer (50C), and silicide films (15). The polysilicon layer (4C) is formed on a main surface (3BS) of a gate insulating film (3B), and the silicon oxide films (14) are formed on the side walls (4CW) of the polysilicon layer (4C). The metal layer (50C) is formed in contact with the main surface (4CS1) of the polysilicon layer (4C) on the opposite side to the gate insulating film (3B). The silicide films (15) are formed on the side walls (50CW) of the metal layer (50C) (which are composed of side walls (51CW and 52CW) of first and second metal layers (51 and 52)). After the silicide films (15) are formed, the metal layer (50C) is protected by the silicide films (15). This structure provides an MOS transistor having a polymetal gate in which oxidation of the metal layer is prevented to realize lower resistivity.

9 Claims, 23 Drawing Sheets

F I G. 18
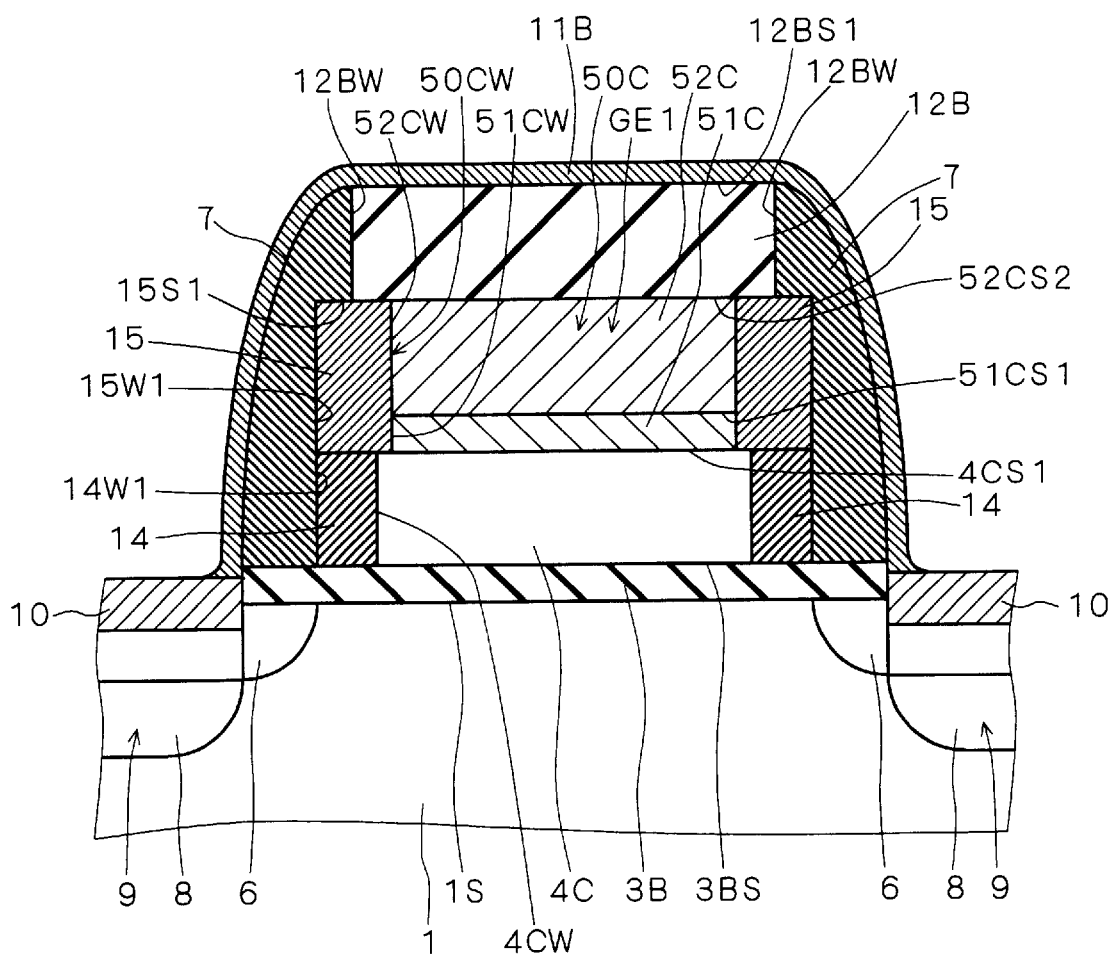

SEMICONDUCTOR DEVICE AND METHOD OF MANUFACTURING SEMICONDUCTOR DEVICE

BACKGROUND OF THE INVENTION

1. Field of the Invention

The present invention relates to semiconductor devices and methods of manufacturing a semiconductor device, and particularly to a semiconductor device having an electrode made of a stacked structure of metal/(poly)silicon and a manufacturing method thereof.

2. Description of the Background Art

FIG. 30 shows a longitudinal section of an MOS transistor 101P as a semiconductor device according to a first conventional technique, which has a polycide gate composed of a stacked structure of silicide/polysilicon. The MOS transistor 101P may be called "a DRAM transistor" since it is used as a transistor in the memory cell area in a DRAM (Dynamic Random Access Memory).

As shown in FIG. 30, the silicon substrate 1P is sectioned by trench isolations 2P into areas in which MOS transistors are formed. A gate insulating film 3P is formed on the main surface of the silicon substrate 1P, which is made of a film of silicon oxide obtained by applying thermal oxidation to the main surface.

A gate electrode GE1P is formed on the gate insulating film 3P, which is comprised of a polysilicon layer 4P and a silicide layer 60P stacked in this order as the main materials. Silicon oxide films or reoxidation films 14P are formed on the sides of the polysilicon layer 4P.

This polycide gate structure is formed as described below. First, polysilicon and silicide are sequentially stacked and a TEOS oxide film (not shown) is formed thereon. The TEOS oxide film is then patterned by photolithography and the silicide layer and the polysilicon layer are etched together by using the patterned TEOS oxide film as a hard mask in anisotropic etching. Subsequently, reoxidation (thermal oxidation) is applied to the sides of the etched polysilicon layer. The gate electrode GE1P composed of the polysilicon layer 4P, the reoxidation films 14P, and the silicide layer 60P is thus formed as shown in FIG. 30.

Side wall spacers or spacers 7P are formed in contact with the gate insulating film 3P and the sides of the polysilicon layer 4P and the silicide 60P. The spacers 7P are formed by forming a dielectric film, such as a TEOS oxide film or silicon nitride film, to cover the gate electrode GE1P and then etching it back.

The structure also has source/drain extension regions 6P and source/drain regions 8P (hereinafter these are also referred to as "source/drain regions 9P" together) formed in the main surface of the silicon substrate 1P. These regions 6P and 8P are formed by ion implantation.

Although not shown in FIG. 30, interlayer film is formed to cover the gate electrode GE1P and interconnections connected to the gate electrode GE1P and the like are formed on the interlayer film.

Next, FIG. 31 shows a longitudinal section of an MOS transistor 102P as a semiconductor device according to a second conventional technique. The MOS transistor 102P may be referred to as "a logic transistor" since it is applied to a logic circuit, for example.

As shown in FIG. 31, the MOS transistor 102P has a gate electrode GE2P and salicide layers or silicide layers 10P as source/drain region electrodes, both of so-called salicide structure formed by self-aligned silicidation. The structure is equivalent to that of the above-described MOS transistor 101P (see FIG. 30) in other respects. The MOS transistor 102P is manufactured by the following method.

First, the main surface of the silicon substrate 1P is thermally oxidized to form a silicon oxide film (which forms the gate insulating film 3P later). Then a polysilicon layer and a TEOS oxide film are stacked on the exposed surface of the silicon oxide film and the TEOS oxide film is patterned by photolithography. Subsequently, the polysilicon layer is etched by using the patterned TEOS oxide film as a hard mask in anisotropic etching. Next, the source/drain extension regions 6P are formed by ion implantation and then reoxidation is applied to the sides of the etched polysilicon layer to form reoxidation films 14P. The spacers 7P are then formed and the source/drain regions 8P are formed by ion implantation.

Subsequently, the TEOS oxide film used as a hard mask is etched to expose the upper surface of the polysilicon layer. Next, a metal film, such as cobalt (Co), is formed entirely over the silicon substrate 1P and it is annealed. This annealing causes silicidation (salicidation) of the metal film and the upper surface of the polysilicon layer and the exposed surface of the silicon substrate 1P, which forms the silicide layers or salicide layers 70P and 10P. Next the unreacted metal film is removed by etching. Thus the gate electrode GE2P composed of the silicide layer 70P, the polysilicon layer 4P, and the reoxidation films 14P is formed as shown in FIG. 31.

Next, FIG. 32 shows a longitudinal section of a semiconductor device (which may be referred to as a hybrid transistor) 104P as a semiconductor device according to a third conventional technique, which has the MOS transistor 101P and an MOS transistor 103P corresponding to the MOS transistor 102P. While the MOS transistor 103P is the same as the above-described MOS transistor (logic transistor) 102P in that it is applied to a logic circuit, for example, it differs from the MOS transistor 102P in that the gate electrode GE1P of the MOS transistor (DRAM transistor) 101P is applied to its gate electrode. A method for manufacturing the hybrid transistor 104P will now be described.

As shown in FIG. 32, the regions for formation of the MOS transistors 101P and 103P are sectioned by the trench isolations 2P. The region in which the DRAM transistor 101P is formed is referred to as a memory cell area and the region in which the logic transistor 103P is formed is referred to as a logic area.

Subsequently, thermal oxidation is applied to the main surface of the silicon substrate 1P to form a silicon oxide film which forms the gate insulating film 3P later. Next, the memory cell area is covered with a resist mask by photolithography, and the silicon oxide film in the logic area is removed by wet etching. Then, the resist mask is removed, and thermal oxidation is performed again to form a thin silicon oxide film in the logic area and a thick silicon oxide film in the memory cell area. After that, the gate electrodes GE1P are formed in the two MOS transistors 101P and 103P, as described in the method for manufacturing the MOS transistor 101P. In the following manufacturing steps, basically, given manufacturing process step is applied to one of the memory cell area and the logic area with the other covered by resist mask or the like. For example, in the process steps for forming the source/drain regions 9P in the MOS transistors 101P and 103P, ion implantation is applied sequentially to the memory cell area and the logic area.

Then, with a mask formed on it except in the vicinities of the source/drain regions 9P in the logic area, a metal film, e.g. cobalt (Co), is deposited on the entirety of the silicon substrate 1P. The salicide layers 10P are then formed by annealing on the source/drain regions 8P (or 9P) in the logic area. Unreacted metal film is then etched away.

The MOS transistors 101P to 104P according to the conventional techniques have the following problems (1) to (5).

<Problem (1): Problems due to Resistance of Silicide Layer>

The polycide gate electrodes GE1P and GE2P of the conventional MOS transistors 101P to 104P have higher gate resistance than a gate electrode composed of a stacked structure of polysilicon layer/metal layer (hereinafter referred to as a polymetal gate (electrode)). The conventional MOS transistors 101P to 104P therefore have problems of large interconnection delay, generating much heat, etc.

<Problem (2): Problem in Formation of Gate electrode>

The gate electrodes GE1P and GE2P of the conventional MOS transistors 101P to 104P are difficult to form, since they have larger aspect ratio than the polymetal gate. More specifically, the conventional MOS transistors 101P to 104P have high gate resistivity as stated above, and therefore the silicide layers 60P and 70P having high resistivity are formed thick to reduce the resistance of the gate electrodes GE1P and GE2P. For example, while a sheet resistance of 2 $\Omega$/sqr can be obtained with tungsten (W) having a thickness of 60 nm, realizing it with tungsten silicide (WSi) requires a film thickness of 400 nm, and realizing it with cobalt silicide (CoSi) requires a film thickness of 130 nm. In these cases, in the gate electrode formation process, anisotropic etching must be applied to a film having a thickness of about 300 to 600 nm, i.e. the thickness of the silicide layer plus the thickness of the polysilicon layer (about 100 to 200 nm) and the hard mask (about 50 to 100 nm). Under such a condition, it is very difficult to form a gate electrode having a gate length of 0.2 $\mu$m or smaller at high yield.

<Problem (3): Problem in Ion Implantation Process>

In relation to the problem (2) above, a problem is encountered in the ion implantation in the process of forming the source/drain regions 9P. That is to say, a large implant angle cannot be set in the ion implantation since the aspect ratio of the gate electrode is high as stated above, and therefore ions must be implanted almost vertically. In this case, the implant angle must be set small in oblique implantation such as pocket implantation (also called halo implantation, NUDC, etc.), for example, which causes inconveniences in the characteristics of the MOS transistor, such as reduction in the short-channel characteristic.

<Problem (4): Problem due to Salicide Structure>

In the MOS transistor 102P having the salicide structure, the two salicide layers 10P and 70P have equivalent film thickness. Accordingly, when the silicide layer 70P included in the gate electrode GE2P is formed thick to reduce the sheet resistance of the gate electrode, the salicide layers 10P on the source/drain regions 8P are formed thick, too. When the salicide layers 10P are formed deeper than the junction between the source/drain regions 9P and the silicon substrate 1P, the leakage current increases at the junction. Such junction leakage current may be suppressed or prevented by forming the source/drain regions 9P further deeper. However, forming the source/drain regions 9P still deeper raises another problem that the short channel-characteristic of the MOS transistor is reduced.

As stated above, the MOS transistor 102P manufactured by the salicide process has the problem that setting of the thickness of the salicide layers 10P and 70P is very difficult.

<Problem (5): Problem Caused When Metal Layer is Substituted for Silicide Layer of Gate Electrode>

To solve the problems (1) to (4), a polymetal gate can be used in place of the polycide gate. However, simply replacing the silicide layer with the metal layer raises the following problems.

First, when the reoxidation film is formed by thermal oxidation after forming and patterning the polysilicon layer and the metal layer, and also when oxide film like the spacers 7P and interlayer film are formed, the metal layer is exposed to the oxidation atmosphere and oxidized (from the exposed surface). Also, the metal layer will be oxidized when thermal process is performed with oxide film like the spacers 7P in contact with the metal layer. Then the original object of reducing the resistance of the gate electrode cannot be achieved.

SUMMARY OF THE INVENTION (1) According to a first aspect of the present invention, a semiconductor device comprises: a silicon layer; a silicon-containing layer which is located on a side wall of the silicon layer; a metal layer in contact with a main surface of the silicon layer; and a protective layer provided on a side wall of the metal layer and having a side wall smoothly connected to a side wall of the silicon-containing layer on the opposite side to the silicon layer, and in the semiconductor device of the first aspect, the silicon layer, the silicon-containing layer, the metal layer and the protective layer constitutes a conductive layer.

(2) Preferably, according to a second aspect, in the semiconductor device, the side wall of the protective layer does not overhang relative to the side wall of the silicon-containing layer.

(3) Preferably, according to a third aspect, in the semiconductor device, the protective layer is made of a silicide.

(4) Preferably, according to a fourth aspect, in the semiconductor device, the protective layer is made of a dielectric which does not contain oxygen.

(5) Preferably, according to a fifth aspect, in the semiconductor device, the dielectric which does not contain oxygen is silicon nitride.

(6) Preferably, according to a sixth aspect, in the semiconductor device, the silicon-containing layer is out of contact with the metal layer.

(7) Preferably, according to a seventh aspect, in the semiconductor device, the metal layer at least comprises a barrier metal layer in contact with the silicon layer.

(8) Preferably, according to an eighth aspect, in the semiconductor device, the conductive layer forms a gate electrode of an MIS transistor.

(9) According to a ninth aspect of the present invention, a semiconductor device manufacturing method comprises the steps of: (a) forming a first silicon layer; (b) forming a metal layer in a given region on a main surface of the first silicon layer; (c) forming a protective layer on a side wall of the metal layer; and (d) after the step (c), removing part of the first silicon layer which is not covered by the protective layer and the metal layer.

(10) Preferably, according to a tenth aspect, in the semiconductor device manufacturing method, the step (c) comprises the steps of; (c-1) forming a second silicon layer on the side wall of the metal layer at least, and (c-2) causing silicidation reaction to occur between the metal layer and the second silicon layer to form a silicide layer as the protective layer.

(11) Preferably, according to an eleventh aspect, the semiconductor device manufacturing method further comprises a step (f) of applying an isotropic etching to the metal layer before the step (c).

(12) Preferably, according to a twelfth aspect, in the semiconductor device manufacturing method, the step (c) comprises the steps of; (c-1) forming a dielectric layer not containing oxygen to cover the metal layer in contact with the side wall of the metal layer, and (c-2) etching back the dielectric layer, leaving the dielectric layer as the protective layer on the side wall of the metal layer at least.

(13) Preferably, according to a thirteenth aspect, the semiconductor device manufacturing method further comprises, after the step (d), a step (g) of oxidizing a side wall of the silicon layer to form a silicon oxide film.

(14) Preferably, according to a fourteenth aspect, in the semiconductor device manufacturing method, the oxidation in the step (g) is performed in such a manner that the silicon oxide film is out of contact with the metal layer.

(15) Preferably, according to a fifteenth aspect, in the semiconductor device manufacturing method, the step (b) at least comprises a step of forming a barrier metal layer in contact with the silicon layer.

(16) A sixteenth aspect of the present invention is related to a semiconductor device which is manufactured by the above-described semiconductor device manufacturing method.

(1) According to the first aspect of the invention, both side walls of the protective layer and the silicon-containing layer are smoothly connected, so that voids are not formed when another layer (e.g. the side wall spacer in an MIS transistor) is formed on the side walls. This prevents the problem that oxygen or chemicals used in cleaning treatments enter through breaks (peels) in the layer or pinholes formed by such voids to oxidize or/and dissolve or deteriorate the metal layer. As a result, it is possible to certainly prevent oxidation of the metal layer and prevent an increase in resistance of the conductive layer.

As compared with a conventional conductive layer composed of a silicon layer and a silicide layer, the conductive layer made of a silicon layer and a metal layer as the base materials provides the following effects. That is to say, when the thickness of the metal layer is set equal to that of the silicide layer, the resistance of the conductive layer can be much lower than that of the conventional conductive layer. This reduces the amount of heat generated by the semiconductor device and reduces the interconnection delay to realize higher speed operation. When the resistance value of the metal layer is set equal to that of the silicide layer, the thickness of the conductive layer can be much smaller than that of the conventional conductive layer. In this case, when the conductive layer is applied as a gate electrode in an MIS transistor, for example, the aspect ratio of the gate electrode can be smaller than that in the conventional conductive layer, so that the ion implantation in the step of forming the source/drain region can be carried out reliably. This provides an MIS transistor with improved short-channel characteristic. Further, reducing the thickness of the conductive layer remarkably facilitates improvement of the flatness of interlayer film and the like which are formed on the conductive layer, which allows the semiconductor device to be formed in an increased number of layers.

(2) According to the second aspect, the effect of preventing formation of voids mentioned in the first aspect can be more certainly obtained since the side wall of the protective layer does not overhang relative to the side wall of the silicon-containing layer. This more certainly prevents oxidation of the metal layer and therefore prevents the increase in the resistance.

(3) According to the third aspect, the protective layer can be formed in a self-aligned manner by forming the metal layer and then depositing silicon on the side wall of the metal layer and annealing it, for example. Thus the protective layer can be formed simply and reliably.

(4) According to the fourth aspect, the metal layer is not oxidized due to the composition of the dielectric layer since the protective layer does not contain oxygen. Thus the effect of preventing oxidation is effectively exerted and the increase in resistance of the metal layer can be prevented more reliably.

(5) According to the fifth aspect, silicon nitride is used as the protective layer (the dielectric not containing oxygen), so that the oxidation resistance and chemical resistance can be improved as compared with an application in which silicide is used as the protective layer.

(6) According to the sixth aspect, the silicon-containing layer is out of contact with the metal layer. Accordingly the effect of preventing oxidation can be obtained even when a material which contains oxygen, such as silicon oxide film, is used as the silicon-containing layer. This more certainly prevents the increase in resistance of the metal layer.

(7) According to the seventh aspect, at least a barrier metal layer is formed in the metal layer in contact with the silicon layer, which suppresses or prevents mutual reaction between the materials in the silicon layer and the metal layer.

(8) According to the eighth aspect, through the effect of any of the first to seventh aspects, this type of transistor can reduce the power dissipation and operate at higher speed, as compared with this type of transistor having a silicide gate (which corresponds to the conventional conductive layer) composed of a silicon layer and a silicide layer. Also the transistor can provide improved short-channel characteristic.

(9) According to the ninth aspect, the protective layer is formed on the side wall of the metal layer in the step (c). This prevents the metal layer from being oxidized in the following process steps, e.g. in treatments performed in an oxidation atmosphere. Further, even if a thermal treatment is performed after a material which contains oxygen is provided, the metal layer is not oxidized by the oxygen. Moreover, the metal layer is kept away from chemicals in various cleaning steps performed after the protective layer is formed, so that the metal layer will not be dissolved or deteriorated (particularly, not made insulating).

Particularly, since the step (d) of removing given part of the first silicon layer is carried out after the step (c) of forming the protective layer, by using anisotropic etching in the step (d), for example, the protective layer does not overhang relative to the remaining silicon layer. Thus the side wall of the protective layer and the side wall of the remaining silicon layer (the layer formed of the remaining silicon layer) can be formed in smooth shape. Accordingly, voids are not formed even when another layer (for example, side wall spacer in an MIS transistor) is formed on the side walls of the protective layer and the remaining silicon layer. This prevents the problem that oxygen and chemicals used in cleaning treatments enter through breaks of the film and pinholes formed due to such voids to oxidize or dissolve or deteriorate the metal layer.

As a result, it is possible to protect the metal layer from oxidation or/and dissolution or deterioration, and the increase in resistance of the metal layer can be certainly prevented in the semiconductor device. This also allows a wider range of choice of chemicals, thus providing the effect of more effectively performing cleaning.

(10) According to the tenth aspect, the silicide layer (protective layer) can be formed in a self-aligned manner and the protective layer can thus be formed easily and reliably on the side wall of the metal layer.

(11) According to the eleventh aspect, the size of the metal layer can be isotropically reduced by isotropic etching as compared with that formed by the semiconductor device manufacturing method of the ninth or tenth aspect. Accordingly, when the conductive layer including the metal layer and the remaining silicon layer is applied to the gate electrode of an MIS transistor, for example, the gate length can be adjusted and controlled. This enables larger current driving capability and further size reduction and higher degree of integration.

(12) According to the twelfth aspect, the metal layer is not oxidized because of the composition of the dielectric layer in and after the step (c), since the protective layer is made of a dielectric not containing oxygen. Also in treatments performed later in oxidation atmosphere, this prevents oxygen from entering the metal layer, thus preventing oxidation of the metal layer. As a result, it is possible to manufacture a semiconductor device in which the increase in the resistance of the metal layer due to the oxidation can certainly be prevented.

(13) According to the thirteenth aspect, damages given to the silicon layer in the step (d) can be reduced or removed. The effect of the ninth aspect is exerted also in the step (g) and the metal layer is not oxidized.

(14) According to the fourteenth aspect, keeping the silicon oxide film out of contact with the metal layer certainly prevents the silicon oxide film from oxidizing the metal layer. As a result, it is possible to more certainly prevent the increase in resistance of the metal layer, so as to provide a semiconductor device which is free from the increase in resistance of the metal layer due to oxidation.

(15) According to the fifteenth aspect, a barrier metal layer is formed in the metal layer in contact with the silicon layer, which suppresses or prevents mutual reaction between materials of the metal layer and the silicon layer in the manufacturing process.

(16) According to the sixteenth aspect, using the structure including the metal layer and the remaining silicon layer as a conductive layer provides the effect of any of the ninth to fifteenth aspects, thus providing a semiconductor device with reduced power dissipation and increased operation speed, as compared with the conventional conductive layer including a silicide layer and a silicon layer as the main materials.

The present invention has been made to solve the problems above, and an object of the present invention is to provide a semiconductor device having an electrode of the polymetal structure which can solve the above problems (1) to (5) all at once and a method of manufacturing the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 17 and 18 are schematic longitudinal sections used to explain a method of manufacturing the (second) semiconductor device according to the first preferred embodiment.

DESCRIPTION OF THE PREFERRED EMBODIMENTS

<First Preferred Embodiment>

A1. Structures of Semiconductor Devices

Figure 1:
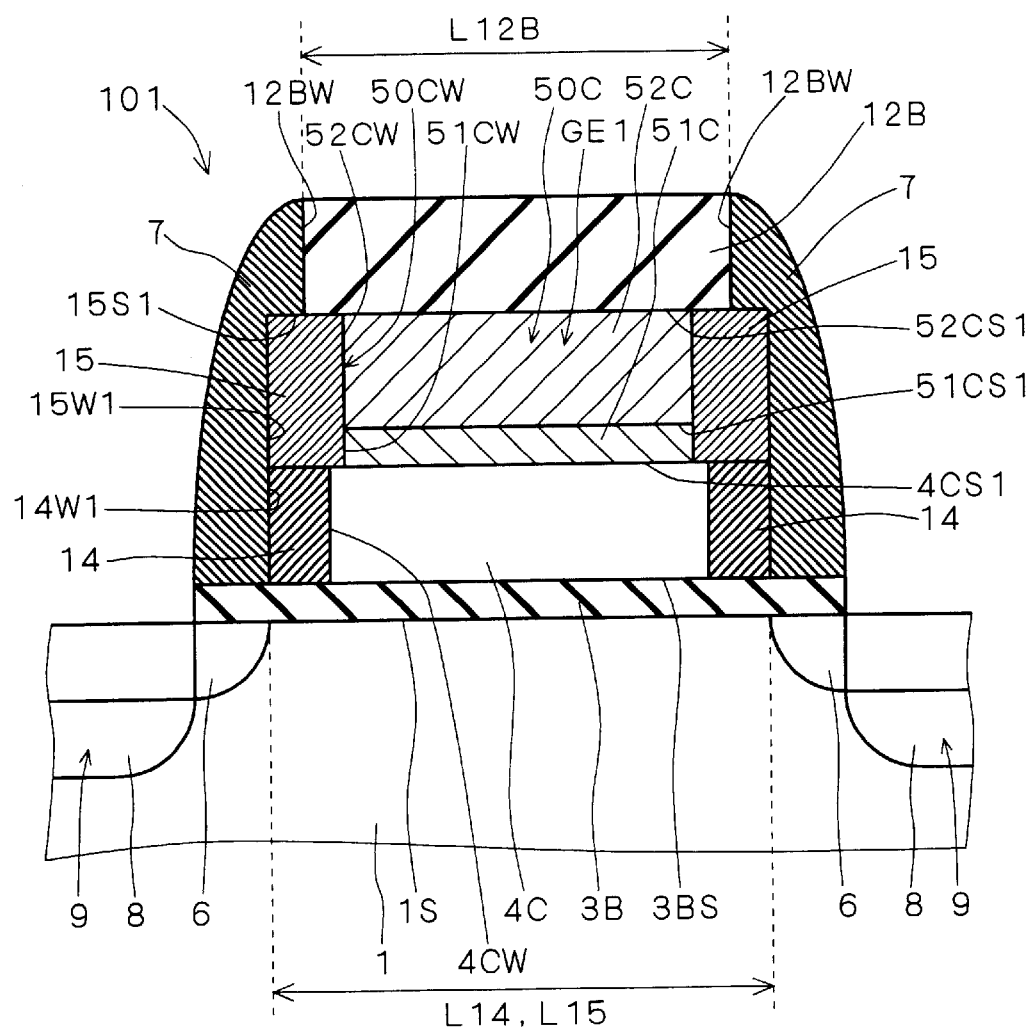
FIG. 1 is a schematic longitudinal section showing a first semiconductor device according to a first preferred embodiment.

FIG. 1 schematically shows a longitudinal section of an MOS transistor as a first semiconductor device 101 according to a first preferred embodiment. The MOS transistor 101 may be referred to as "a DRAM transistor (101)" because it is used as a transistor in the memory cell area in a DRAM, for example.

As shown in FIG. 1, the MOS transistor 101 has a gate insulating film 3B formed on a main surface 1S of a semiconductor substrate 1. In the example described herein, a silicon substrate is used as the semiconductor substrate 1 and a silicon oxide film is used as the gate insulating film 3B.

A gate electrode (a conductive layer) GE1 is formed on the main surface 3BS of the gate insulating film 3B on the opposite side to the silicon substrate 1, which includes a silicon (polysilicon is used herein) layer 4C, silicon oxide films (silicon-containing layers) 14, a metal layer 50C, and silicide films or silicide layers (protective layers) 15.

More specifically, the polysilicon layer 4C is formed on the main surface 3BS of the gate insulating film 3B and the silicon oxide films 14 are formed with the polysilicon layer 4C sandwiched therebetween. That is to say, the silicon oxide films 14 are formed on the main surface 3BS and in contact with the side walls or side wall surfaces 4CW of the polysilicon layer 4C, or on the side walls 4CW of the polysilicon layer 4C and in contact with the main surface 3BS.

The metal layer 50C is formed in contact with the main surface 4CS1 of the polysilicon layer 4C on the opposite side to the gate insulating film 3B. The metal layer 50C includes a first metal layer 51C formed as a barrier metal on the side of the polysilicon layer 4C and a second metal layer 52C formed on the main surface 51CS1 of the first metal layer 51C on the opposite side to the polysilicon layer 4C. In the example described herein, tungsten nitride (WN) is used as the first metal layer 51C and tungsten (W) is used as the second metal layer 52C. However, for example, barrier metal such as titanium nitride (TiN) can be used as the first metal layer 51C, and metal such as titanium (Ti) or copper (Cu) can be used as the second metal layer 52C. The metal layer 50C can be a single layer made of the above-mentioned metal (it can be a single layer made of the barrier metal only), or it can be a multi-layered structure including three or more layers. Particularly, formation of the barrier metal layer in the metal layer 50C at least in contact with the silicon layer 4C, that is, in contact with the main surface 4CS1, suppresses/prevents mutual reaction between the materials in the silicon layer and the metal layer in manufacture.

The silicide films 15 are formed on the side walls 50CW of the metal layer 50C (which is composed of the side walls 51CW and 52 CW of the first and second metal layers 51C and 52C). Particularly, in the gate electrode GE1, the surfaces or side walls 15W1 of the silicide films 15 on the opposite sides to the metal layer 50C are smoothly connected to the surfaces or side walls 14W1 of the silicon oxide films 14 on the opposite sides to the polysilicon layer 4C. Tungsten silicide (WSi) is used as the silicide films 15 herein. When a titanium nitride is used as the first metal layer 51C and titanium is used as the second metal layer 52C, for example, titanium silicide (TiSi) is used as the silicide films 15.

Figure 2:
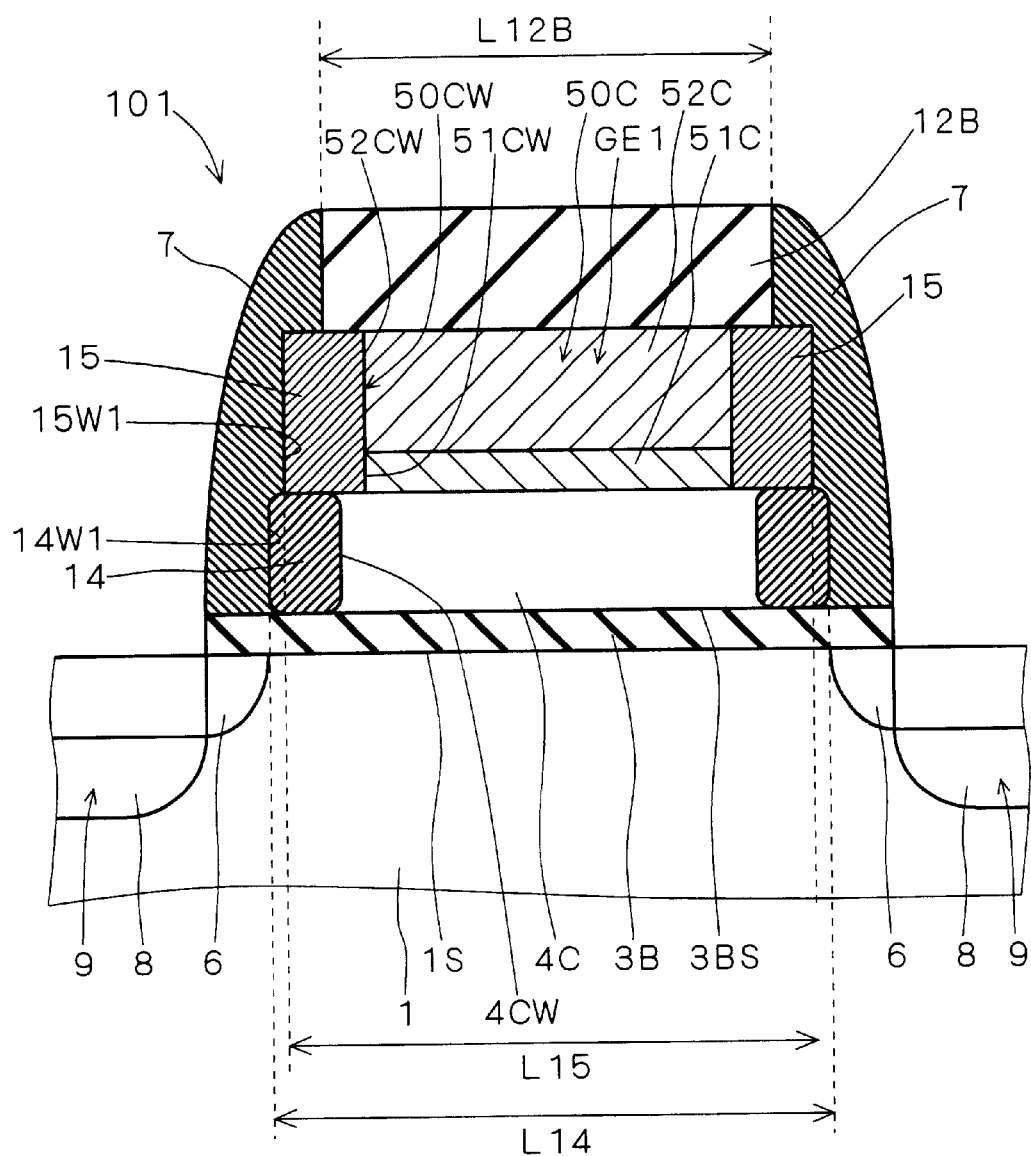
FIG. 2 is a schematic longitudinal section used to explain another structure of the first semiconductor device according to the first preferred embodiment.

FIG. 1 shows an example in which the distance L15 between the side walls 15W1 of the two silicide films 15 provided on both sides of the metal layer 50C is equal to the distance L14 between the side walls 14W1 of the two silicon oxide films 14 provided on both sides of the polysilicon layer 4C ((distance L14)=(distance L15)). However, depending on the method of forming the silicide films 15 and the silicon oxide films 14 described later, the relation (distance L14)>(distance L15) may hold as shown in FIG. 2. However, in the MOS transistor 101, the side walls 15W1 of the silicide films 15 do not overhang towards a side opposite to the metal layer 50C relative to the side walls 14W1 of the silicon oxide films 14 ((distance L15)≦(distance L14)).

A silicon nitride layer 12B is formed on the main surface 52CS1 of the second metal layer 52C on the opposite side to the polysilicon layer 4C (which can be regarded as the same main surface of the metal layer 50C) and on part of the main surfaces 15S1 of the silicide films 15, which connect with the main surface 52CS1, on the opposite side to the silicon oxide films 14. In the MOS transistor 101, the distance L12B between the side walls 12BW of the silicon nitride layer 12B is shorter than the distances L14 and L15.

Side wall spacers (which may simply be referred to as spacers hereinafter) 7 are formed in contact with the side walls 12BW, 14W1, and 15W1 and the main surfaces 15S1 and 3BS. A dielectric, such as silicon oxide or silicon nitride, can be applied as the spacers 7, for example. The part of the gate insulating film 3B located under the polysilicon layer 4C, or the part under the polysilicon layer 4C and the silicon oxide films 14, may be called "a gate insulating film," and the remaining part and the spacers 7 may be called "(side wall) spacers" together.

As shown in FIG. 1, source/drain extension regions 6 extend in areas of given depth from the main surface 1S of the silicon substrate 1, which extend from under the side walls 14W1 of the silicon oxide films 14 on the sides of the edges of the gate insulating film 3B. Further, source/drain regions 8 extend in areas of a given depth (deeper than the regions 6) from the main surface 1S, which extend from the vicinities of the edges of the gate insulating film 3B in the same direction as the source/drain extension regions 6. In this case, the parts of the source/drain extension regions 6 which do not overlap the source/drain regions are called LDD (Lightly Doped Drain). In the description below, the regions 6 and 8 may also be called "source/drain regions 9" together.

Figure 3:
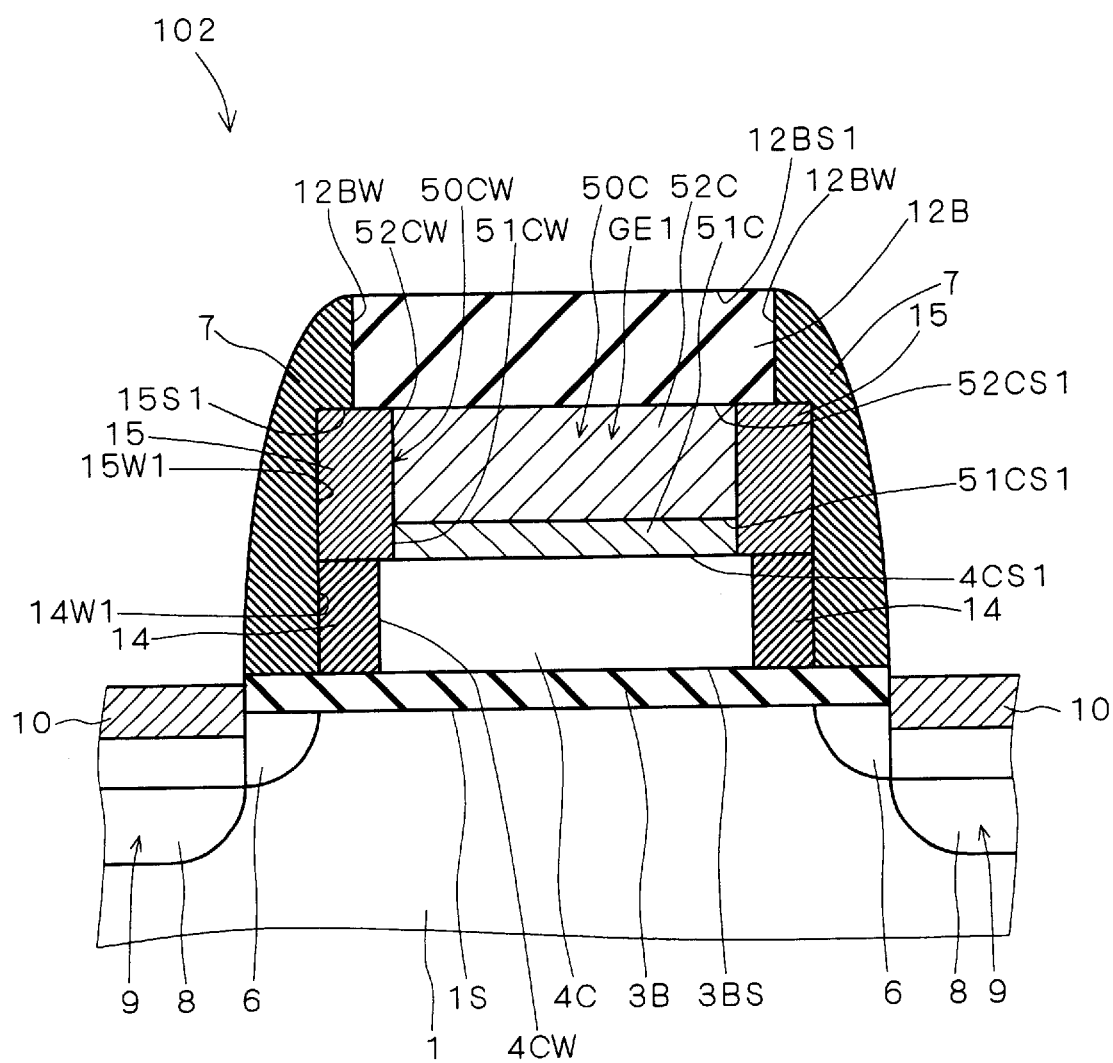
FIG. 3 is a schematic longitudinal section showing a second semiconductor device according to the first preferred embodiment.

FIG. 3 shows a schematic longitudinal section of an MOS transistor as a second semiconductor device 102 according to the first preferred embodiment. As shown in FIG. 3, the MOS transistor 102 has silicide layers or salicide layers 10 in contact with the source/drain regions 8 (or 9) in the above-described structure of the MOS transistor 101. The MOS transistor 102 may also be called "a logic transistor (102)" since it is applied to a logic circuit, for example.

Figure 4:
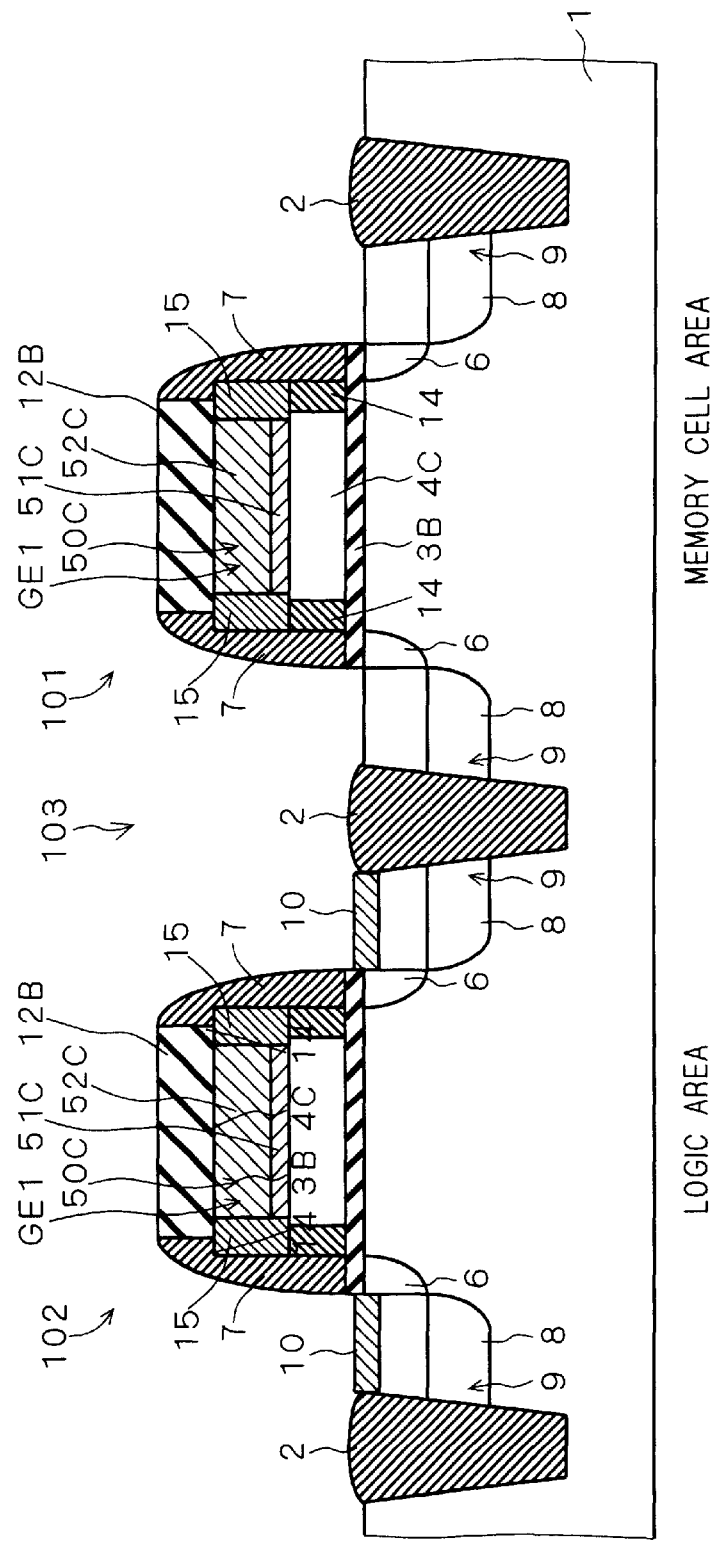
FIG. 4 is a schematic longitudinal section showing a third semiconductor device according to the first preferred embodiment.

FIG. 4 shows a so-called hybrid transistor (e.g. a DRAM) 103 as a third semiconductor device 103 of the first preferred embodiment, in which both the MOS transistors 101 and 102 are formed on the same silicon substrate 1. Needless to say, two or more transistors 101 and 102 may be formed. As shown in FIG. 4, in the hybrid transistor 103, the transistors 101 and 102 (the formation areas thereof) are sectioned by the trench element isolations 2. Element isolations such as LOCOS may be used in place of the trench isolations 2.

Note that FIGS. 1 to 4 do not show interlayer films covering the main surface 1S of the silicon substrate 1, interconnections, and so forth.

B1. Method of Manufacturing the Semiconductor Devices

Next, referring to FIGS. 5 to 18 as well as FIGS. 1 to 4, methods for manufacturing the MOS transistors 101 to 103 will be described. A method for manufacturing the MOS transistor (DRAM transistor) 101 shown in FIG. 1 will be described mainly herein.

Step B1-1. Preparation of Silicon Substrate

Figure 5:
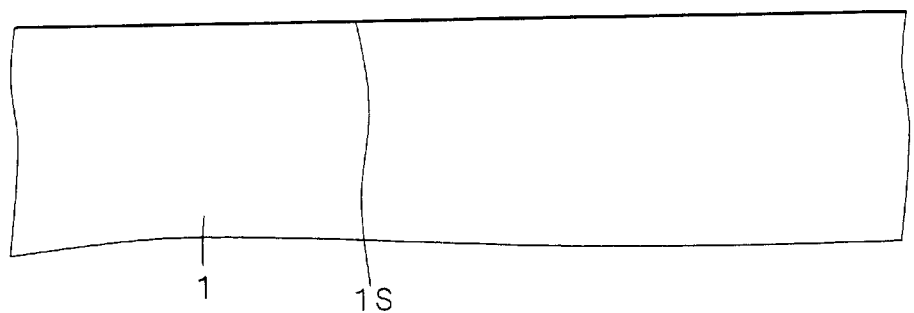
FIGS. 5 to 16 are schematic longitudinal sections used to explain a method of manufacturing the semiconductor devices according to the first preferred embodiment.

First, as shown in FIG. 5, the silicon substrate 1 is prepared. When a plurality of MOS transistors (and other elements) are formed on the silicon substrate 1 as in the hybrid transistor 103, the areas for formation of the elements are sectioned by forming trench element isolations 2.

Step B1-2. Formation of Gate Insulating Film

Figure 6:
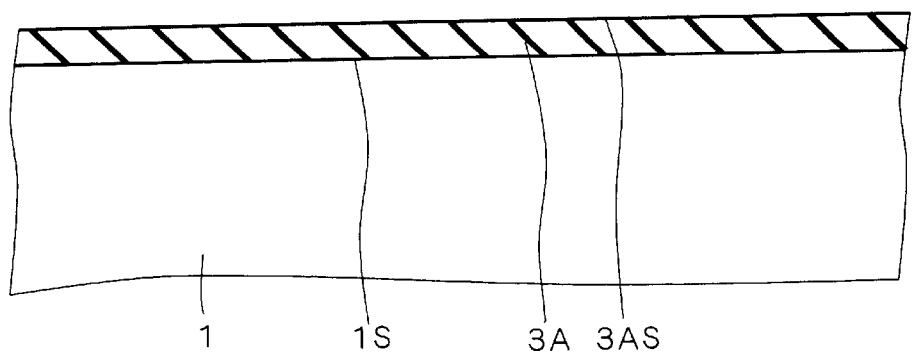

Next, as shown in FIG. 6, thermal oxidation, for example, is applied to the main surface 1S of the silicon substrate 1 to form a silicon oxide film 3A (having a thickness of about 5 to 8 nm), which forms the gate insulating film 3B later (see FIG. 1).

In the MOS transistor (logic transistor) 102, the thickness of the silicon oxide film 3A is set to about 2 to 4 nm. In the hybrid transistor 103, the silicon oxide films 3A differing in thickness are formed by two steps of thermal oxidation, for example. More specifically, a silicon oxide film is formed on the entirety of the main surface 1S in the first thermal oxidation step and then the silicon oxide film on the region for formation of the logic transistor 102 (the logic area) is removed, with the area for formation of the DRAM transistor 101 (the memory cell area) covered with a resist mask by photolithography. Then, after removal of the resist mask, the second thermal oxidation step is performed to form the silicon oxide films 3A differing in thickness. The gate insulating film in the logic transistor is formed thinner so that larger voltage can be applied to the channel to obtain larger driving current, and the gate insulating film in the DRAM transistor is formed thicker to ensure insulation because higher gate voltage is used than in the logic transistor.

Step B1-3. Formation of Silicon Layer for Gate Electrode

Figure 7:
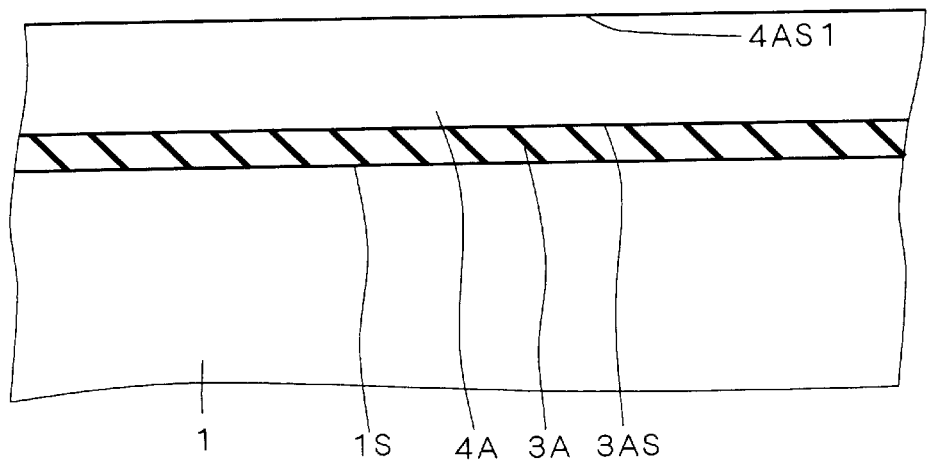

Next, as shown in FIG. 7, a polysilicon layer (a first silicon layer) 4A having a thickness of about 30 to 100 nm is formed on the exposed main surface 3AS (which corresponds to the main surface 3BS) of the silicon oxide film 3A shown in FIG. 6.

At this time, when the MOS transistor 101 (or 102) is applied to a CMOS transistor and it is a single-gate CMOS transistor in which the conductivity type of the (poly)silicon layer forming (part of) the gate electrode of both of the NMOS transistor and PMOS transistor is n type, phosphorus (P) is introduced into the polysilicon layer 4A to a concentration of about 4 to $8E20/cm^3$, for example. In the case of a dual-gate CMOS transistor in which the conductivity type of the (poly)silicon layer of the NMOS transistor is n type and the conductivity type of the PMOS transistor is p type, boron (B) is implanted into the polysilicon layer 4A of the PMOS transistor with an acceleration energy of about 3 to 20 keV and a dose of about 2 to $8E15/cm^2$ (ion implantation), for example. Boron fluoride ($BF_2$) may be used in place of boron, which is ion-implanted with an acceleration energy of about 5 to 40 keV and a dose of about 2 to $8E15/cm^2$. Phosphorus is implanted into the polysilicon layer 4A of the NMOS transistor with an acceleration energy of about 3 to 20 keV and a dose of about 2 to $10E15/cm^2$, for example.

Step B1-4. Formation of Metal Layer for Gate Electrode

Figure 8:
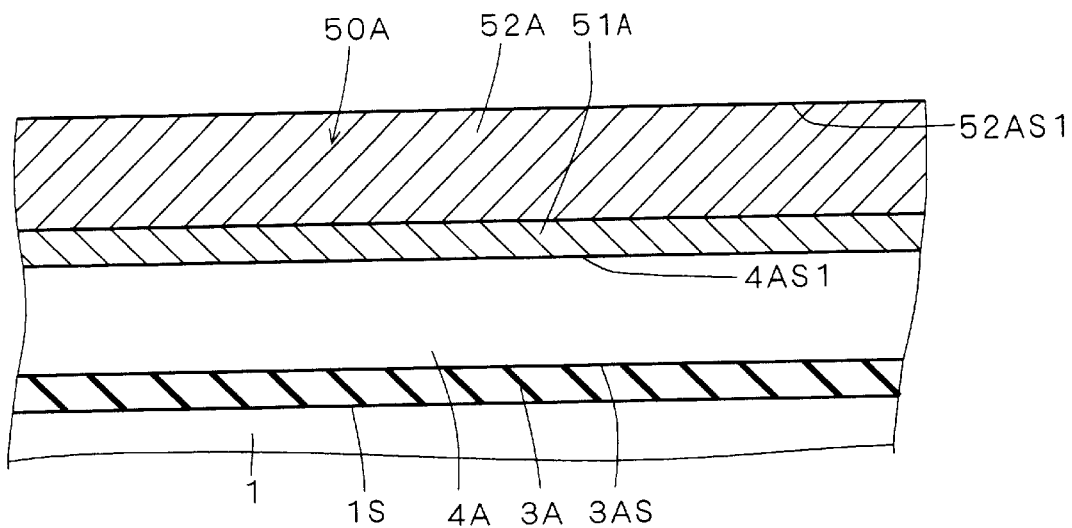

Next, as shown in FIG. 8, a tungsten nitride layer having a thickness of about 2 to 10 nm is formed as the first metal layer 51A as barrier metal on the exposed main surface 4AS1 of the polysilicon layer 4A shown in FIG. 7 (which corresponds to the main surface 4CS1). Subsequently, tungsten having a thickness of about 30 to 100 nm is formed as the second metal layer 52A on the exposed main surface 51AS1 of the first metal layer 51A (which corresponds to the main surface 51CS1). In the description below, the first and second metal layers 51A and 52A may also be called "a metal layer 50A (corresponding to the metal layer 50C)" together.

Step B1-5. Formation of Hard Mask

Figure 9:
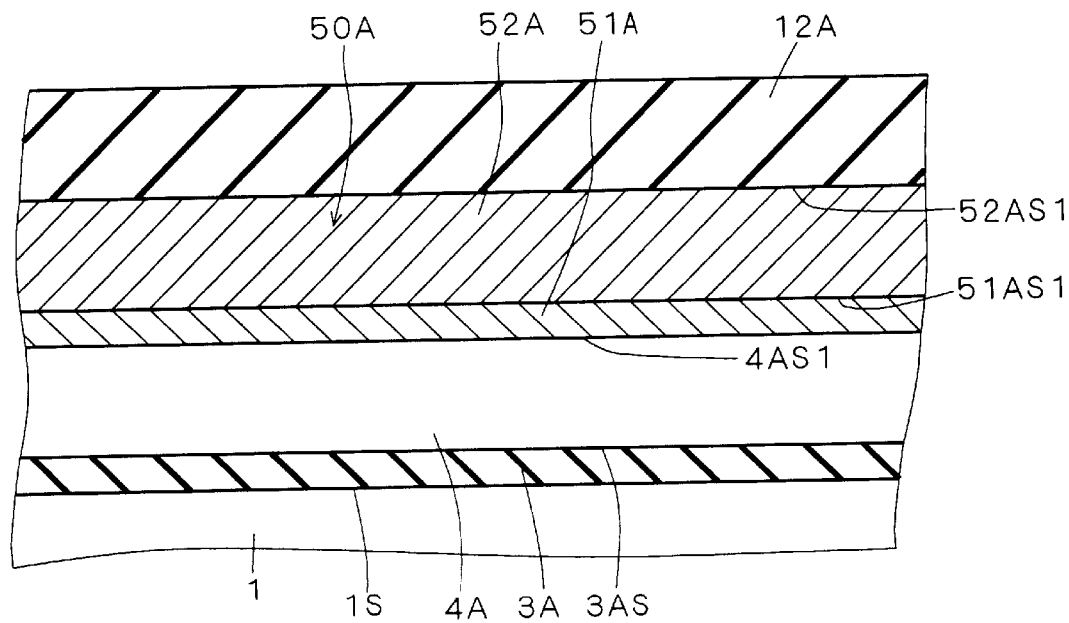
Figure 10:
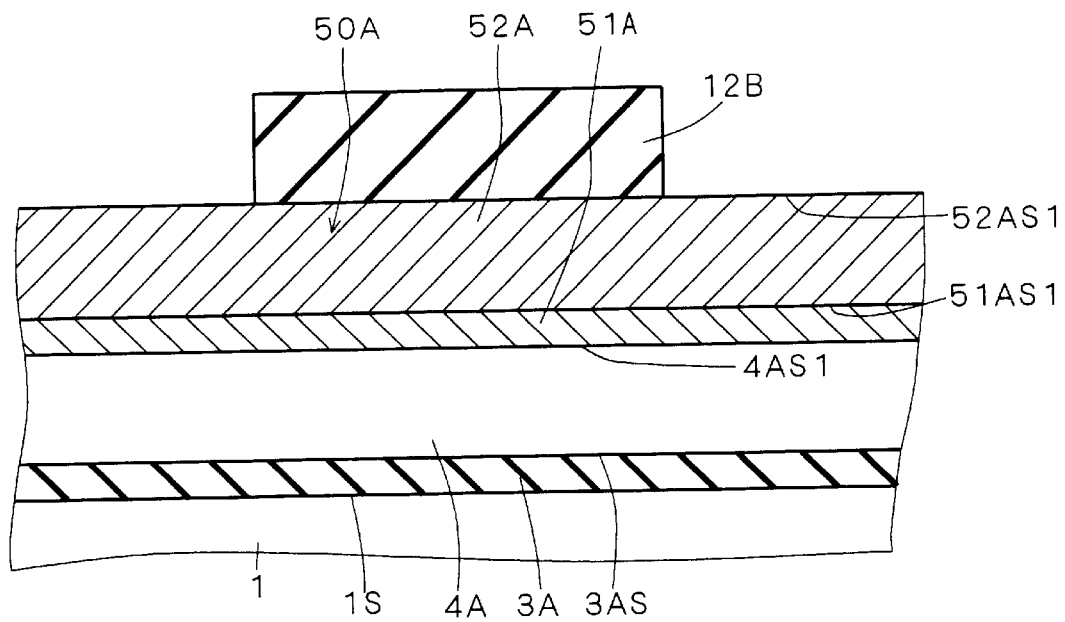

Next, as shown in FIG. 9, a silicon nitride layer 12A having a thickness of about 50 to 200 nm is formed on the exposed main surface 52AS1 of the second metal layer 52A shown in FIG. 8 (which corresponds to the main surface 52CS1). Subsequently, the silicon nitride layer 12A is patterned by using photolithography and anisotropic etching technique to form the silicon nitride layer 12B shown in FIG. 10.

The silicon nitride layer 12B serves as a hard mask in the etching step described later. Other dielectric (dielectric not containing oxygen) serving as the hard mask may be formed in place of the silicon nitride layer 12B (12A).

Step B1-6. Patterning of Metal Layer

Figure 11:
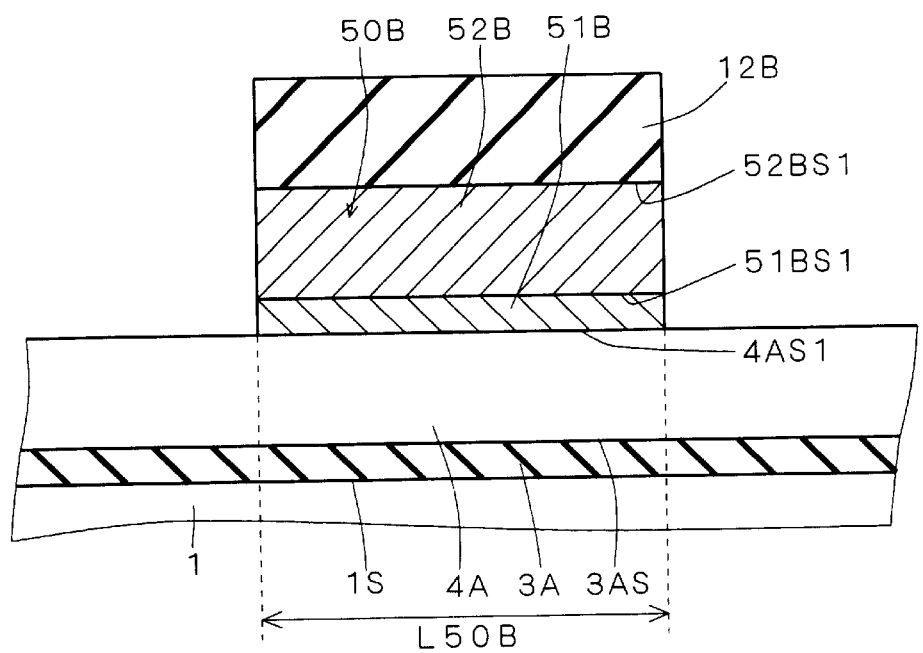

Next, the metal layer 50A is patterned by anisotropic etching using the silicon nitride layer 12B as a hard mask to form a metal layer 50B including first and second metal layers 51B and 52B in given region, as shown in FIG. 11. In the etching, only the metal layer 50A is selectively etched without etching the polysilicon layer 4A by using dry etching with mixed gas of carbon tetrafluoride ($CF_4$), oxygen ($O_2$), and nitrogen ($N_2$), for example. After formation of the metal layer 50B, cleaning is performed to remove foreign matter, etch residue, etc.

Step B1-7. Formation of Protective Layer

Figure 12:
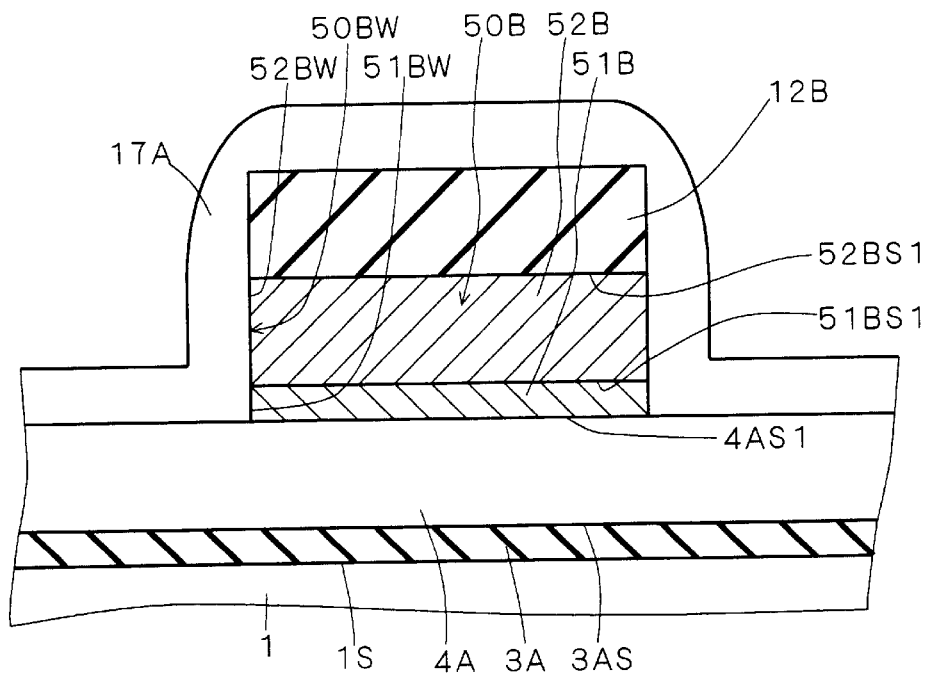

Next, as shown in FIG. 12, a silicon film (a second silicon layer)17A having a thickness of about 5 to 40 nm is formed to cover the silicon nitride layer 12B, the metal layer 50B, and the polysilicon layer 4A. Polysilicon is used as the silicon film 17A herein. The polysilicon film 17A is formed at least on the side walls 50BW of the metal layer 50B (which includes the side walls 51BW and 52BW of the first and second metal layers 51B and 52B). Hence the polysilicon film 17A is formed by using a process which can form polysilicon on the side wall 50BW of the metal layer 50B, e.g. by using CVD.

Figure 13:
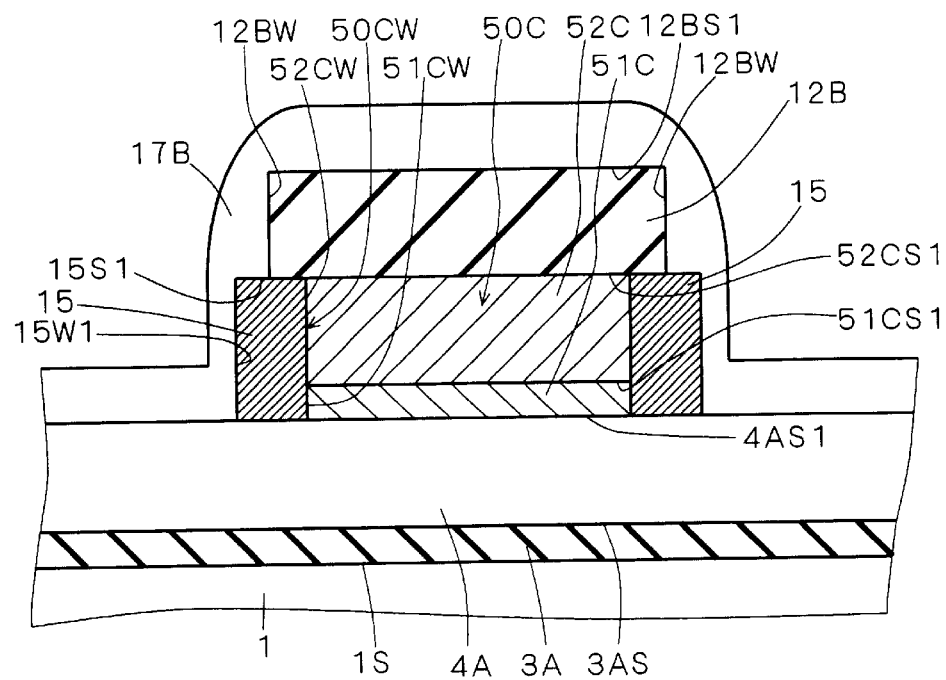

Subsequently, a high-temperature annealing processing, e.g. RTA (Rapid Thermal Annealing) at 700° C. or higher, is performed to cause the silicidation reaction to occur at the interface between the metal layer 50B and the polysilicon film 17A (see the side walls 50W) to form the silicide films (protective layers) 15 shown in FIG. 13 in a self-aligned manner. This silicidation reaction is caused in a non-oxygen atmosphere. In the silicidation reaction, the parts of the metal layer 50B in the vicinities of the side walls 50BW become part of the silicide films 15, and the metal layer 50C shown in FIG. 13 remains. While FIG. 13 shows an example in which parts of the polysilicon film 17A shown in FIG. 12 become silicide, the parts of the polysilicon film 17A on the side walls 50BW may all change to the silicide films 15, depending on the setting of the film thickness or wall thickness (the distance between the side walls) of the silicide films 15 and so forth.

Figure 14:
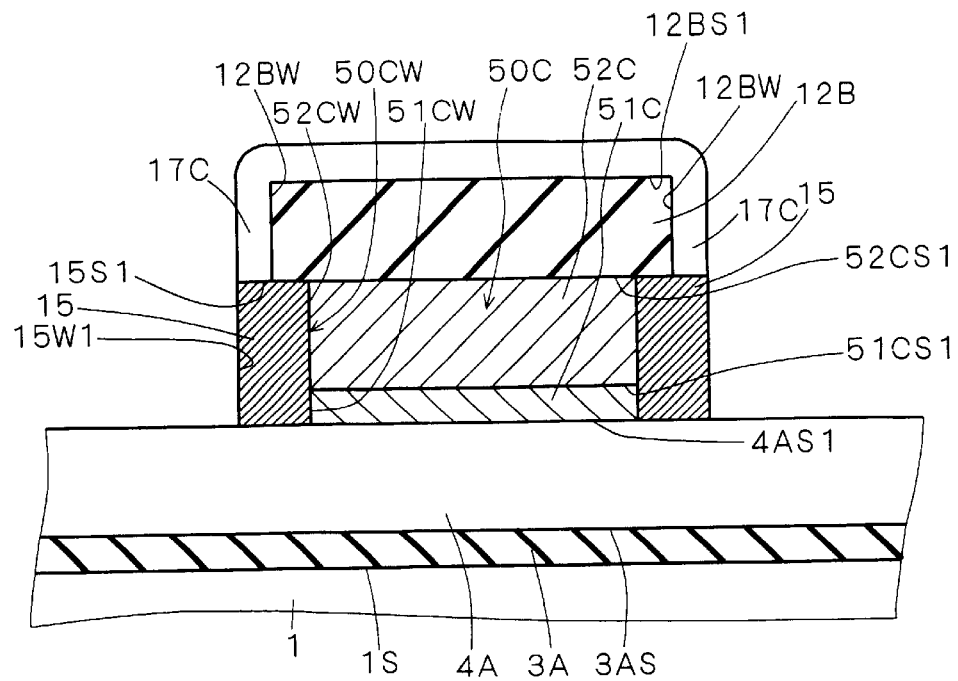

Then the polysilicon film 17A remaining after the silicidation reaction, i.e. the polysilicon film 17B, is removed (see FIG. 14). In this process, the polysilicon film 17B is removed to such an extent that the side walls 15W1 of the silicide films 15 are exposed by isotropic or anisotropic etching like wet etching or dry etching. Part of the polysilicon film 17B remains as polysilicon film 17C on the side walls 12BW of the silicon nitride layer 12B and on its main surface 12BS1 on the opposite side to the metal layer 50C.

Step B1-8. Patterning of Silicon Layer for Gate Electrode

Figure 15:
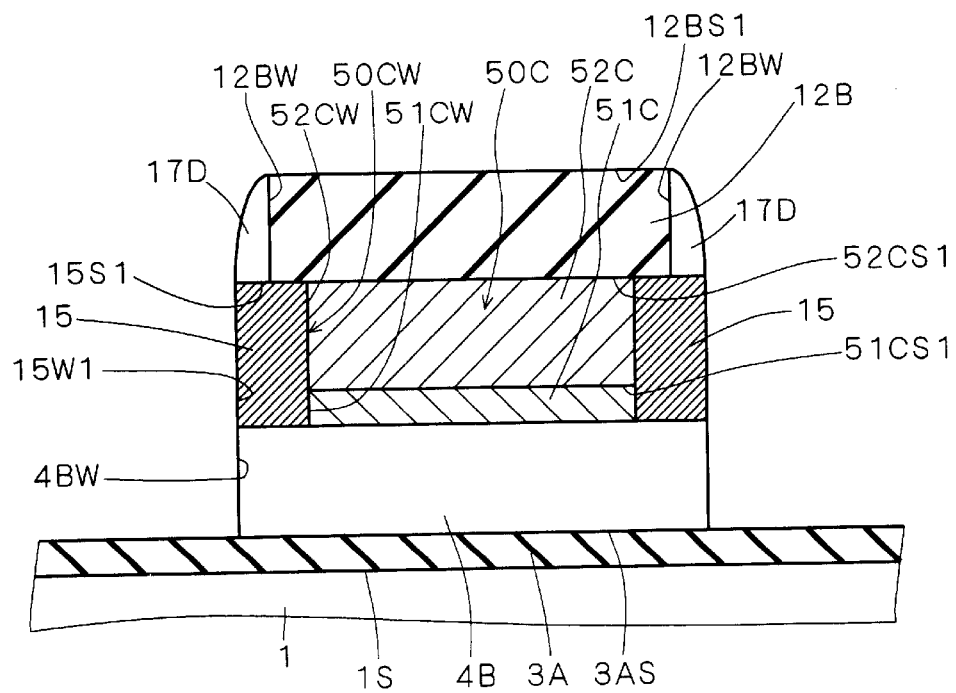

Next, the polysilicon layer 4A is patterned by anisotropic etching using the silicon nitride layer 12B and the silicon oxide film 3A as hard mask or etching stopper (see FIG. 15). At this time, as shown in FIG. 15, the part of the polysilicon layer 4A shown in FIG. 14 which is located under the metal layer 50C and the silicide films 15 remains as a polysilicon layer 4B. While FIG. 15 shows an example in which the part of the polysilicon film 17C shown in FIG. 14 which is located on the main surfaces 15S1 of the silicide films 15 remains as polysilicon film 17D, the polysilicon film 17C may be removed entirely. Subsequently, cleaning processing is performed to remove foreign matter, etch residue, etc.

Step B1-9. Reoxidation

Figure 16:
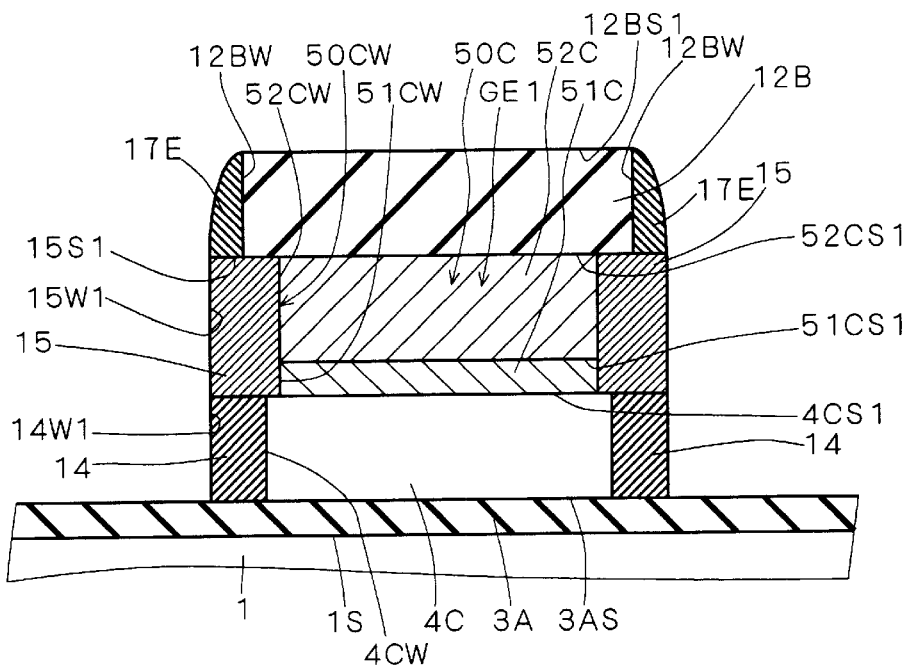

Next, the side walls 4BW of the polysilicon layer 4B shown in FIG. 15 are thermally oxidized (reoxidation) to form the silicon oxide films (reoxidation films) 14 having a film thickness or wall thickness of about 5 to 20 nm as shown in FIG. 16. This reoxidation can reduce or remove damages caused in formation of the polysilicon layer 4B. Although not fully shown in FIG. 16, oxidation further progresses in the exposed part of the silicon oxide film 3A in this oxidation process. The silicon films 17D shown in FIG. 15 are also oxidized at the same time and form silicon oxide films 17E.

Step B1-10. Formation of Source/Drain Extension Regions

Next the source/drain extension regions 6 are formed by ion implantation using the silicon nitride layer 12B and the silicon oxide films 17E (or the silicide films 15) as masks (see FIG. 1).

At this time, the regions 6 in the DRAM transistor 101 are formed by implanting phosphorus with an acceleration energy of about 5 to 40 keV and a dose of about 1 to $5E13/cm^2$, or by implanting arsenic with an acceleration energy of about 10 to 100 keV and a dose of about 1 to $5E13/cm^2$, for example.

In the logic transistor 102, the regions 6 in a PMOS transistor are formed by ion-implanting boron with an acceleration energy of about 3 to 10 keV and a dose of about 0.5 to $3E14/cm^2$, or by ion-implanting boron fluoride ($BF_2$) with an acceleration energy of about 5 to 20 keV and a dose of about 0.5 to $3E14/cm^2$, for example. When pocket implantation is performed, arsenic is implanted with an acceleration energy of about 50 to 150 keV and a dose of about 1 to $4E13/cm^2$. To form the regions 6 in an NMOS transistor, arsenic is ion-implanted with an acceleration energy of about 10 to 100 keV and a dose of about 0.5 to $5E14/cm^2$, or phosphorus is ion-implanted with an acceleration energy of about 5 to 40 keV and a dose of about 1 to $8E13/cm^2$, for example. The ion implantation to the area for formation of the PMOS transistor or NMOS transistor is performed with the formation area for the other MOS transistor covered by resist mask by photolithography. Such selective ion implantation is also applied to the ion implantation to the DRAM transistor 101 and the logic transistor 102 in the hybrid transistor 103.

Step B1-11. Formation of Side Wall Spacers

Subsequently, a dielectric, such as a silicon oxide film or a silicon nitride film, is formed to about 30 to 80 nm to cover the entirety of the main surface 1S of the silicon substrate 1, which is etched back to form the side wall spacers 7 having a wall thickness or width of about 30 to 80 nm (see FIG. 1). In this step, the silicon oxide films 17E shown in FIG. 16 are integrated with the silicon oxide film or silicon nitride film and form the spacers 7.

Step B1-12. Formation of Source/Drain Regions

Subsequently, the source/drain regions 8 are formed by ion implantation using the spacers 7 and the silicon nitride layer 12B as masks (see FIG. 1).

For formation of the source/drain regions 8 in the DRAM transistor 101, phosphorus is ion-implanted with an acceleration energy of about 30 to 150 keV and a dose of about 1E14 to $3E15/cm^2$, for example. For formation of the regions 8 in the logic transistor 102 made of a PMOS transistor, boron is implanted with an acceleration energy of about 2 to 20 keV and a dose of about 1 to $8E15/cm^2$, or boron fluoride ($BF_2$) is implanted with an acceleration energy of about 10 to 40 keV and a dose of about 1 to $8E15/cm^2$, for example. For formation of the source/drain regions 8 in the logic transistor 102 made of an NMOS transistor, arsenic is implanted with an acceleration energy of about 10 to 50 keV and a dose of about 1 to $8E15/cm^2$. The ion implantation is selectively performed by using resist mask or the like, as described in the step B1-10.

The DRAM transistor 101 shown in FIG. 1 is completed by the steps B1-1 to B1-12, and the manufacturing process moves to the step B1-14 described below. In the process of manufacturing the logic transistor 102, the next process B1-13 is performed and then the process moves to the step B1-14.

Step B1-13. Formation of Salicide Layer in Source/Drain Regions

Figure 17:
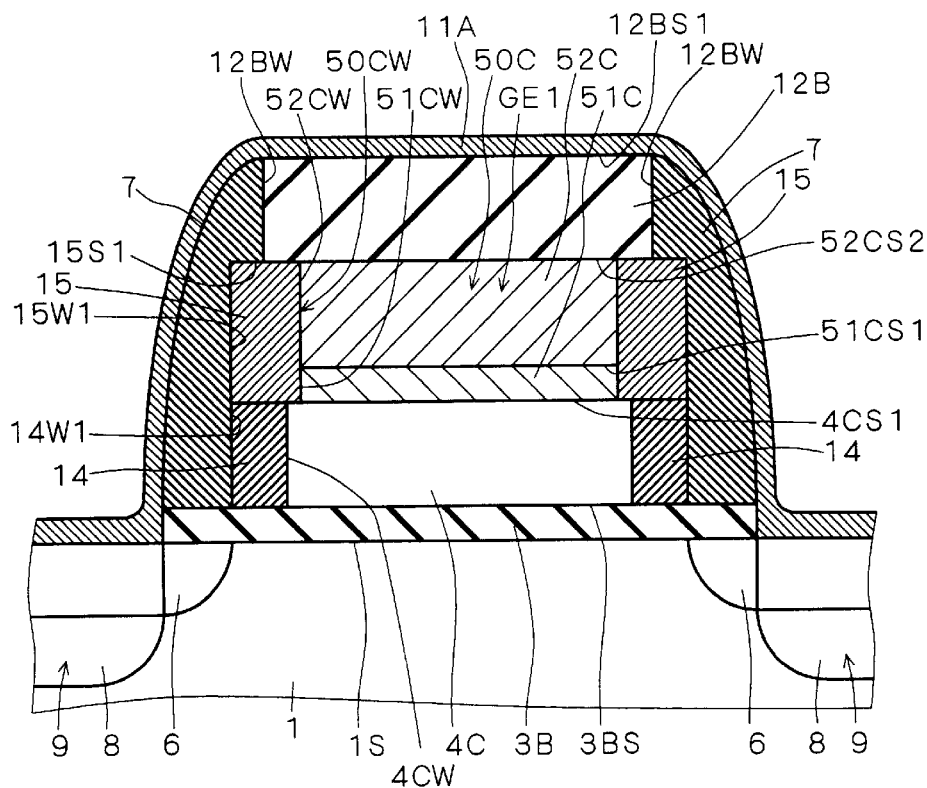

As shown in FIG. 17, in the process of manufacturing the logic transistor 102, a metal film 11A, such as cobalt (Co), is formed to entirely cover the main surface 1S of the silicon substrate 1. Then annealing is applied to cause silicidation or salicidation of the metal film 11A and the source/drain regions 8 (or 9) to form the silicide layers or salicide layers 10 as shown in FIG. 18. Subsequently, the unreacted part 11B of the metal film 11A is removed and the logic transistor 102 shown in FIG. 3 is completed.

In the hybrid transistor 103, the region for formation of the DRAM transistor 101 is covered by a dielectric or salicide mask, e.g. a TEOS (Tetra Ethyl Ortho Silicate) oxide film, to prevent silicidation reaction from occurring in the source/drain regions 8 (or 9) in the transistor 101. The salicide mask is then removed.

Step B1-14. Formation of Interlayer Film, Interconnections, etc.

Subsequently, an interlayer film is formed to entirely cover the main surface 1S of the silicon substrate 1 and given interconnections are formed. The silicon nitride layer 12B which served as a hard mask in the manufacturing process forms part of the interlayer film after the MOS transistor is completed.

As described so far, according to the method for manufacturing the MOS transistors 101 to 103, the side walls 50CW of the metal layer 50C are covered by the silicide films 15 in the step B1-7, so that the metal layer 50C is not oxidized in the manufacturing steps performed after the silicide films 15 are formed. For example, the metal layer 50C is not oxidized in the processing performed in an atmosphere of oxidation in the reoxidation step B1-9, and the metal layer 50C is not oxidized by oxygen in the spacers 7 and the interlayer film in thermal processes performed after the step B1-11 of forming the spacers 7 and the step B1-14 of forming the interlayer film. This prevents an increase in resistance of the gate electrode GE1 which would be caused when the metal layer 50C is oxidized. Particularly, the effect of preventing the increase in the resistance can be obtained more certainly when the reoxidation films 14 are formed in such a manner that the ends of the reoxidation films 14 on the sides of the polysilicon layer 4C are kept out of contact with the metal layer 50C, as shown in FIG. 1.

Furthermore, since the metal layer 50C is kept away from chemicals in the various cleaning steps performed after the silicide films 15 are formed, the metal layer 50C will neither be dissolved nor deteriorated (especially, not made insulating). Thus it is possible to prevent dissolution and deterioration of the metal layer 50C, so as to prevent the increase in the resistance of the gate electrode GE1. Moreover, since this relaxes the need to consider dissolution of the metal layer, the chemicals can be selected in a wider range of choice to perform more effective cleaning.

As described above, the MOS transistors 101 to 103 can certainly avoid the inconveniences which will be caused when the silicide layers 60P and 70P in the gate electrodes GE1P and GE2P of the conventional MOS transistors 101P to 103P are simply replaced by metal layers. As a result, when the metal layer 50C is formed to the same thickness as the conventional silicide layers 60P and 70P, the resistance value of the gate electrode GE1 can remarkably be reduced as compared with those of the conventional gate electrodes GE1P and GE2P. In addition, reducing the resistance of the gate electrode reduces the amount of heat generated by the MOS transistor and also reduces the interconnection delay and thus enables higher speed operation. Furthermore, the reduction in the interconnection delay eliminates the need of circuitry which has been provided as measures against the interconnection delay in conventional MOS transistors (or semiconductor devices having MOS transistors). This facilitates manufacture of larger-scaled semiconductor devices and remarkably reduces the circuit design cost, and eliminating the need to allow for space of such circuitry enables size reduction of the semiconductor devices.

On the other hand, when the resistance of the metal layer 50C is set equivalent to those of the conventional silicide layers 60P and 70P, the thickness of the gate electrode GE1 can be considerably reduced as compared with the conventional gate electrodes GE1P and GE2P. At this time, the aspect ratio of the gate electrode GE1 (or the elements forming it) is smaller than those in the conventional devices, so that the ion implantation in the step of forming the source/drain regions 8 and 9 (the step B1-10 and step B1-12) can be performed reliably. As a result, the MOS transistors 101 to 103 can provide improved short-channel characteristic as compared with the conventional MOS transistors 101P to 103P. Furthermore, the reduction in the thickness of the gate electrode considerably facilitates improvement of the flatness of the interlayer film etc.

Unlike the method of manufacturing the conventional MOS transistor 102P, the method of manufacturing the MOS transistors 101 to 103 does not contain the step of causing salicidation to form the silicide layer 70P of the gate electrode GE2P and the salicide layers 10P on the source/drain regions 9P at the same time. Accordingly the method is free from the problem caused by the salicidation (the problem (4) explained above).

Figure 33:
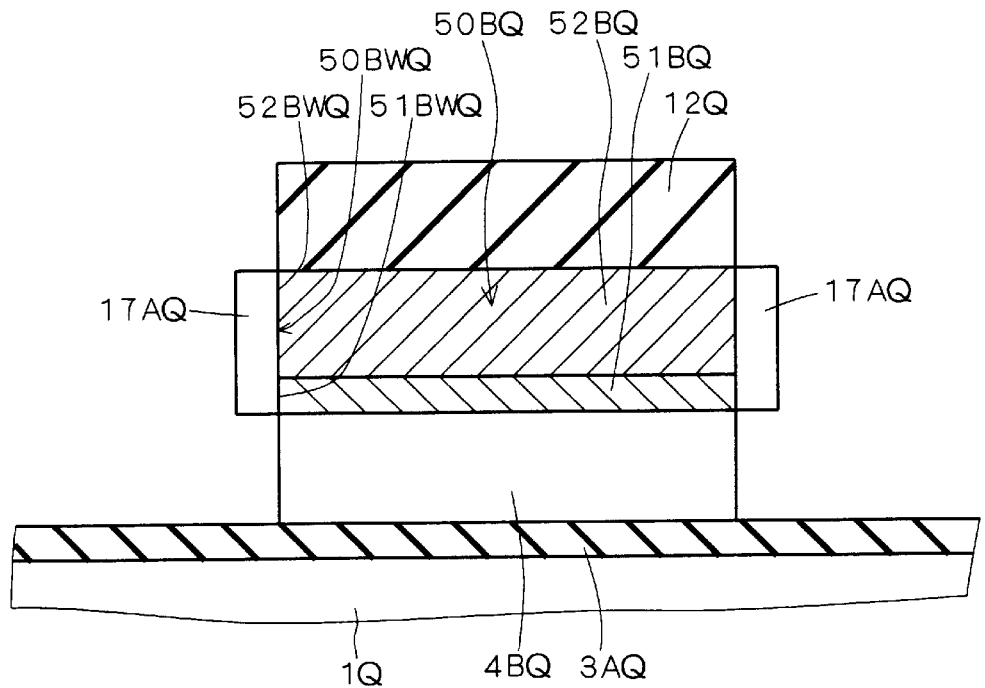
FIGS. 33 to 35 are schematic longitudinal sections used to explain a method of manufacturing a semiconductor device in comparison with a prior art.

Japanese Patent Laying-Open No.7-202189 discloses a gate electrode made of a stacked structure of a metal layer and a polysilicon layer having silicide films on the side walls. According to the first prior art of this reference, the gate electrode is formed as follows. That is to say, as shown in FIG. 33, a silicon oxide film (gate insulating film) 3AQ is formed on a silicon substrate 1Q, and a polysilicon layer, a titanium nitride layer (barrier metal layer), a tungsten layer, and a silicon nitride layer are sequentially formed on the silicon oxide film 3AQ, and they are patterned to form layers 4BQ, 51BQ, 52BQ, and 12Q. In this process, anisotropic etching to the titanium nitride layer 51BQ and the tungsten layer 52BQ (hereinafter also referred to as "a metal layer 50BQ" together) is performed by using a mixed gas which contains a reactant gas containing silicon (silicon tetrachloride ($SiCl_4$) is shown as an example) and a reactant gas containing halogen (chlorine ($Cl_2$) is shown as an example). Accordingly silicon-containing deposit 17AQ attaches on the side walls 50BWQ of the metal layer 50BQ (which includes the side walls 51BWQ and 52BWQ of the layers 51BQ and 52BQ). In the first prior art, silicidation is caused between the silicon-containing deposit 17AQ and the metal layer 50Q to form the silicide films 15Q shown in FIG. 34. In this way, the method of forming the gate electrode according to the first prior art and the method of forming the gate electrode GE1 of the first preferred embodiment considerably differ from each other in the methods of forming the silicide films 15Q and 15 on the side walls 50CWQ and 50CW of the metal layers 50CQ and 50C.

Furthermore, in the manufacturing method of the first preferred embodiment, the gate electrode GE1 is formed by using two steps of patterning, in which the silicide films 15 are formed after the metal layer 50B is formed by patterning (see FIG. 12), and then the polysilicon layer 4B is formed by patterning. However, the first prior art clearly differs in that the silicide films 15Q are formed after formation of the polysilicon layer 4BQ, or after the entire layers on the gate insulating film 3AQ are patterned in advance.

The gate electrode GE1 of the first preferred embodiment and the gate electrode of the first prior art considerably differ in structure due to the difference between the manufacturing methods. FIG. 35 shows an MOS transistor 101Q formed by applying the reoxidation step B1-9 to the source/drain region formation step B1-12 to the semiconductor device shown in FIG. 34.

First, the following important difference exists due to the difference in the order in which the silicide films 15 and 15Q and the polysilicon layers 4B and 4BQ are formed. That is to say, as can be clearly seen by comparing FIG. 35 and FIG. 1, in the gate electrode GE1Q of the MOS transistor 101Q, the surfaces or side walls 15W1Q of the silicide films 15Q on the opposite sides to the metal layer 50CQ overhang towards the sides of the spacers 7Q relative to the surfaces or side walls 14W1Q of the silicon oxide films (reoxidation films) 14Q on the opposite sides to the polysilicon layer 4CQ. Accordingly the gate electrode GE1Q has overhangs 45QN. In other words, the distance L15Q between the side walls 15W1Q of the two silicide films 15Q facing each other through the metal layer 50CQ is larger than the distance L14Q between the side walls 14W1Q of the two silicon oxide films 14Q facing each other through the polysilicon layer 4CQ ((distance L15Q)>(distance L14Q)). On the other hand, as already stated, in the gate electrode GE1 of the first preferred embodiment, the side walls 15W1 of the silicide films 15 do not overhang relative to the silicon oxide films 14W1 ((distance L15)≦(distance L14)).

In this case, as shown in FIG. 1 and FIG. 35, depending on presence/absence of the overhangs 45QN, the source/drain regions 9 and 9Q are formed by ion implantation in different positions in the MOS transistors 101 and 101Q. More specifically, when the distances L14 and L14Q are equal, the ends of the source/drain extension regions 6 in the MOS transistor 101 shown in FIG. 1 are formed under the vicinities of the side walls 14W1 of the silicon oxide films 14. However, in the MOS transistor 101Q shown in FIG. 35, the ends of the regions 6Q are away from the side walls 14W1Q by the width of the overhangs 45QN. That is to say, they are located under the vicinities of the side walls 15W1Q of the silicide films 15Q. Similarly, in the MOS transistor 101Q, the ends of the source/drain regions 8Q are located outward as compared with those in the MOS transistor 101 by the width of the overhangs 7QN of the spacers 7Q formed in correspondence with the overhangs 45QN. Accordingly, the MOS transistor 101Q has larger channel resistance and parasitic resistance and therefore smaller current driving capability than the MOS transistor 101 of the first preferred embodiment. Apparently, it seems that the difference can be eliminated by applying oblique implantation to form the source/drain regions 9Q in the MOS transistor 101Q. However, when oblique implantation is used, the overhangs 45QN and 7QN narrow the range in which the implanted ions travel in oblique direction (the effect is noticeable when a plurality of MOS transistors are provided side by side), and the oblique implantation will not be able to solve the difference in position between the source/drain regions 9Q. Further, when the source/drain extension regions 6Q are formed by oblique implantation, the implant angle must be set large because of the overhangs 7QN. In this case, the regions 6Q penetrate under the gate electrode GE1Q, which considerably deteriorates the short-channel characteristic of the MOS transistor 101Q.

Moreover, in the MOS transistor 101Q, the vicinities of the overhangs 45QN may be left unfilled in formation of the spacers 7Q, and then a void 7QV may be formed (see FIG. 35). This may cause the spacers 7Q to peel off or form pinholes. Then, chemicals used in cleaning steps will penetrate through the peeled film or pinholes to dissolve or deteriorate the metal layer 50CQ. Further, oxygen may penetrate through the peeled film and the like to oxide the metal layer 50CQ, which will largely reduce the manufacturing yield.

Figure 34:
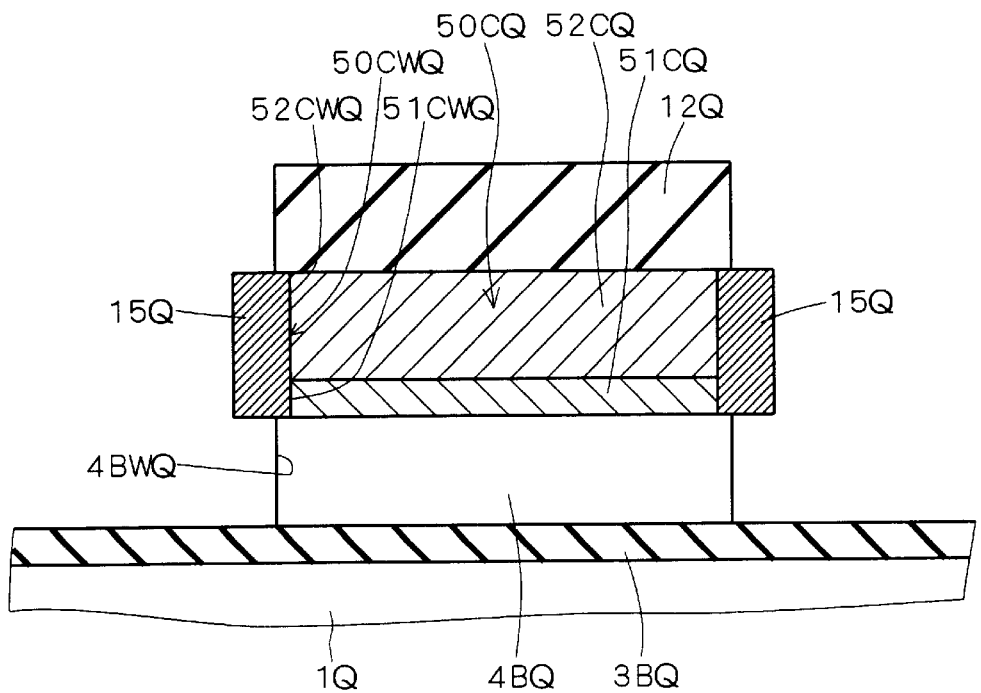
Figure 35:
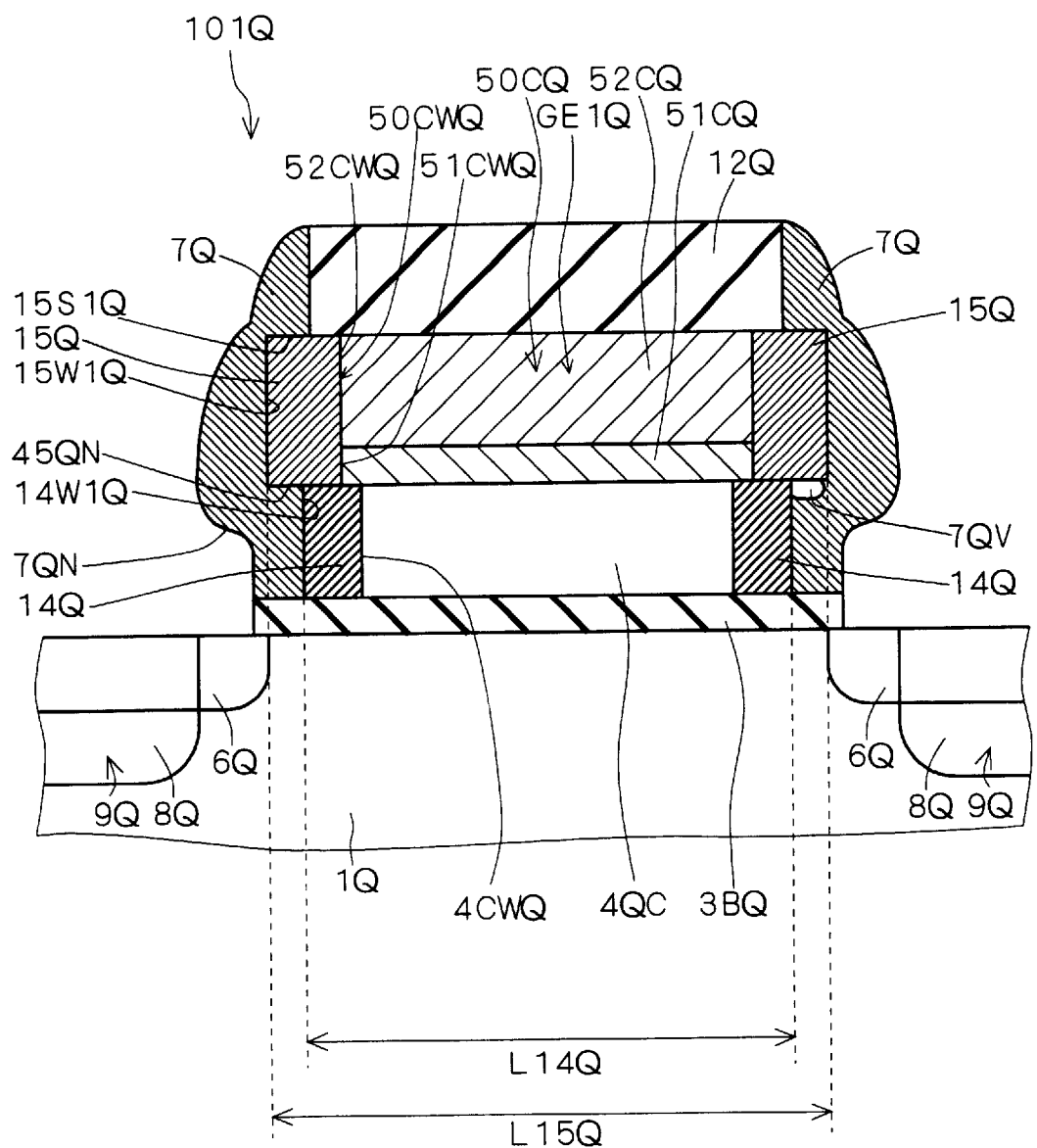

Further, as can be clearly seen by comparing FIG. 15 and FIG. 34 which show the structures obtained before formation of the reoxidation films 14 and 14Q, in the method of manufacturing the MOS transistor 101, before formation of the reoxidation films 14, the side walls 4BW of the polysilicon layer 4B are at the same positions as the side walls 15W1 of the silicide films. In contrast, as shown in FIG. 34, in the manufacturing method of the first prior art, the side walls 4BWQ of the polysilicon layer 4BQ are at positions deeper than the surfaces or side walls 15WQ of the silicide films 15Q on the opposite sides to the metal layer 50CQ. Due to the difference in relative position of the side walls 4BW and 4BWQ and the side walls 15W1 and 15W1Q before formation of the reoxidation films 14 and 14Q, the silicon oxide films 14Q in the gate electrode GE1Q are more likely to come in contact with the metal layer 50CQ, even if the film thicknesses or wall thicknesses of the films 14 and 14Q, and 15 and 15Q are set equal (compare FIG. 1 and FIG. 35). That is to say, the gate electrode GE1Q is more likely to suffer from the problem that the metal layer 50CQ is oxidized by oxygen in the silicon oxide films 14Q. In these respects, the gate electrode GE1 and the MOS transistor 101 of the first preferred embodiment are superior to the gate electrode GE1Q and the MOS transistor 101Q.

In the first prior art, the anisotropic etching for forming the polysilicon layer 4BQ is performed by using the silicon-containing deposit 17AQ as a mask. However, it seems difficult to form a sufficient amount of silicon-containing deposit on the side walls 50BWQ of the metal layer 50BQ in practice, for sufficient etching selectivity cannot be ensured between the silicon-containing deposit 17AQ and polysilicon. Further, the amount of the deposit will largely differ depending on the position of the MOS transistor on the main surface of the silicon substrate or silicon wafer and the shape of the gate electrode, and therefore the use of the deposit seems to be unsuitable as a method for stably manufacturing uniform MOS transistors. In contrast, in the MOS transistors 101 to 103, the protective layers can be formed easily and reliably in the step B1-7.

An electrode (word line) having a similar structure is disclosed in U.S. Pat. No. 5,736,455, too. In the second prior art disclosed in the reference, first, a polysilicon layer, a barrier metal layer such as a tungsten nitride layer, a tungsten layer, and a silicon oxide film are sequentially formed and patterned on a silicon oxide film (gate insulating film) formed on a silicon substrate. Then polysilicon is formed to cover the elements on the gate insulating film and annealing is applied to form tungsten silicide film on the side walls of the tungsten layer. Subsequently the remaining polysilicon is oxidized and the silicon oxide film is removed by wet etching.

As stated above, in the second prior art, all layers on the gate insulating film are patterned first and then the silicide film is formed, instead of performing two steps of patterning as performed in the manufacturing method of the first preferred embodiment. Accordingly, the electrode of the second prior art has the same structure as that shown in FIG. 34. Hence the above description made about the first prior art also applies to the second prior art.

In addition, in the manufacturing method of the second prior art, it seems difficult to select a cleaning solution or chemical agent when performing cleaning step after the patterning step and before the step of depositing polysilicon. That is to say, since three kinds of materials, i.e. metal, polysilicon, and silicon oxide, are exposed after the patterning step, it will be difficult to find a chemical agent which can effectively clean it without dissolving or deteriorating the three kinds of materials, especially, the metal layer whose chemical resistance is lower than the other two kinds of materials.

In the manufacturing method of the first preferred embodiment, as stated above, the step B1-7 of forming the protective layer is performed after the step B1-6 of forming the metal layer 50B by patterning (see FIG. 12), so as to cover the side walls of the metal layer with the silicide films (protective layers) 15 (see FIG. 13). That is to say, the three kinds of materials are not exposed to the chemical agent in this manufacturing method. Accordingly, as stated above, this manufacturing method can certainly prevent the metal layer from being dissolved or deteriorated by chemical agent and thus prevent the increase in the resistance. The above-described effect of enabling a wider range of choice of chemical agents to perform more effective cleaning is obtained also from this point of view.

<Second Preferred Embodiment>

Next, an MOS transistor will be described as a semiconductor device 104 according to a second preferred embodiment. An example in which the MOS transistor 104 is a DRAM transistor will be described herein, but the description can also be applied to logic transistors. Characteristic parts of the MOS transistor 104 will mainly be described below, and the same components as those in the MOS transistors 101 to 103 are shown by the same reference characters and not described fully again. This also applies to the third preferred embodiment described later.

A2. Structure of Semiconductor Device

Figure 19:
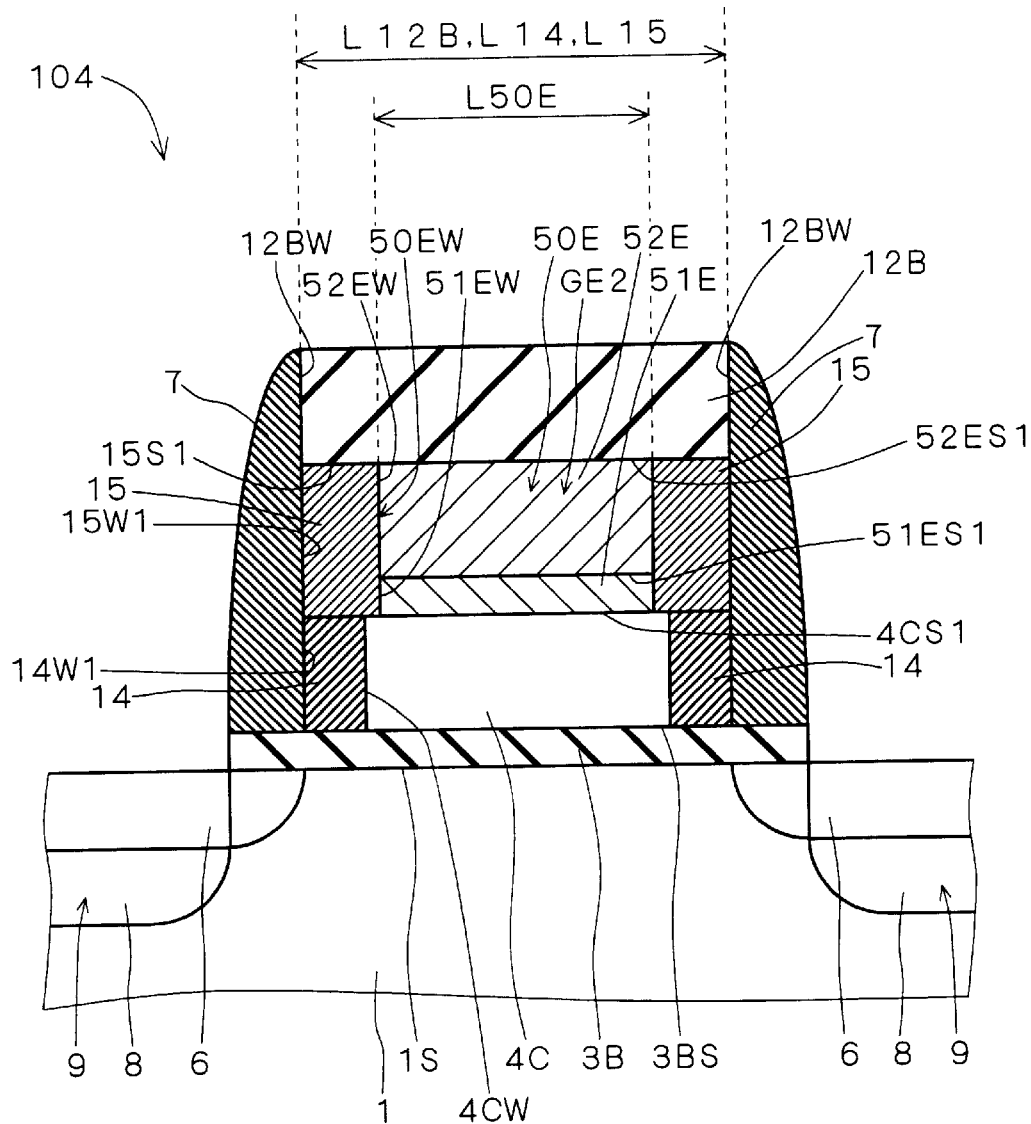
FIG. 19 is a schematic longitudinal section showing a semiconductor device according to a second preferred embodiment.

FIG. 19 shows a schematic longitudinal section of the MOS transistor 104. As shown in FIG. 19, the gate electrode (conductive layer) GE2 of the MOS transistor 104 includes a metal layer 50E (which corresponds to the metal layer 50C) including first and second metal layers 51E and 52E, silicide films 15 formed on the side walls 50EW of the metal layer 50E (which includes the side walls 51EW and 52EW of the first and second metal layers 51E and 52E and corresponds to the side walls 50CW), a (poly)silicon layer 4C, and silicon oxide films (silicon-containing films) 14. The first and second metal layers 51E and 52E have main surfaces 51ES1 and 52ES1 respectively corresponding to the main surfaces 51CS1 and 52CS1 (see FIG. 1).

Particularly, in the MOS transistor 104, the distance L15 between the side walls 15W1 of the two silicide films 15 facing each other through the metal layer 50E and the distance L14 between the side walls 14W1 of the two silicon oxide films 14 facing each other through the polysilicon layer 4C are approximately equal to the distance L12B between the side walls 12BW of the silicon nitride layer 12B. The distance L50E between the side walls 50EW of the metal layer 50E is smaller than the distance L12B. Like those in the MOS transistors 101 to 103, the side walls 15W1 of the silicide films 15 and the side walls 14W1 of the silicon oxide films 14 smoothly continue and the side walls 15W1 do not overhang relative to the side walls 14W1 towards the opposite sides to the metal layer 50E ((distance L15)≦(distance L14)).

B2. Method for Manufacturing the Semiconductor Device

Next, a method for manufacturing the MOS transistor 104 will be described referring to FIG. 19 and FIGS. 20 to 24. First, the semiconductor device shown in FIG. 11 is prepared by the already-described manufacturing steps B1-1 to B1-6.

Step B2-1. Etching of Metal Layer

Figure 20:
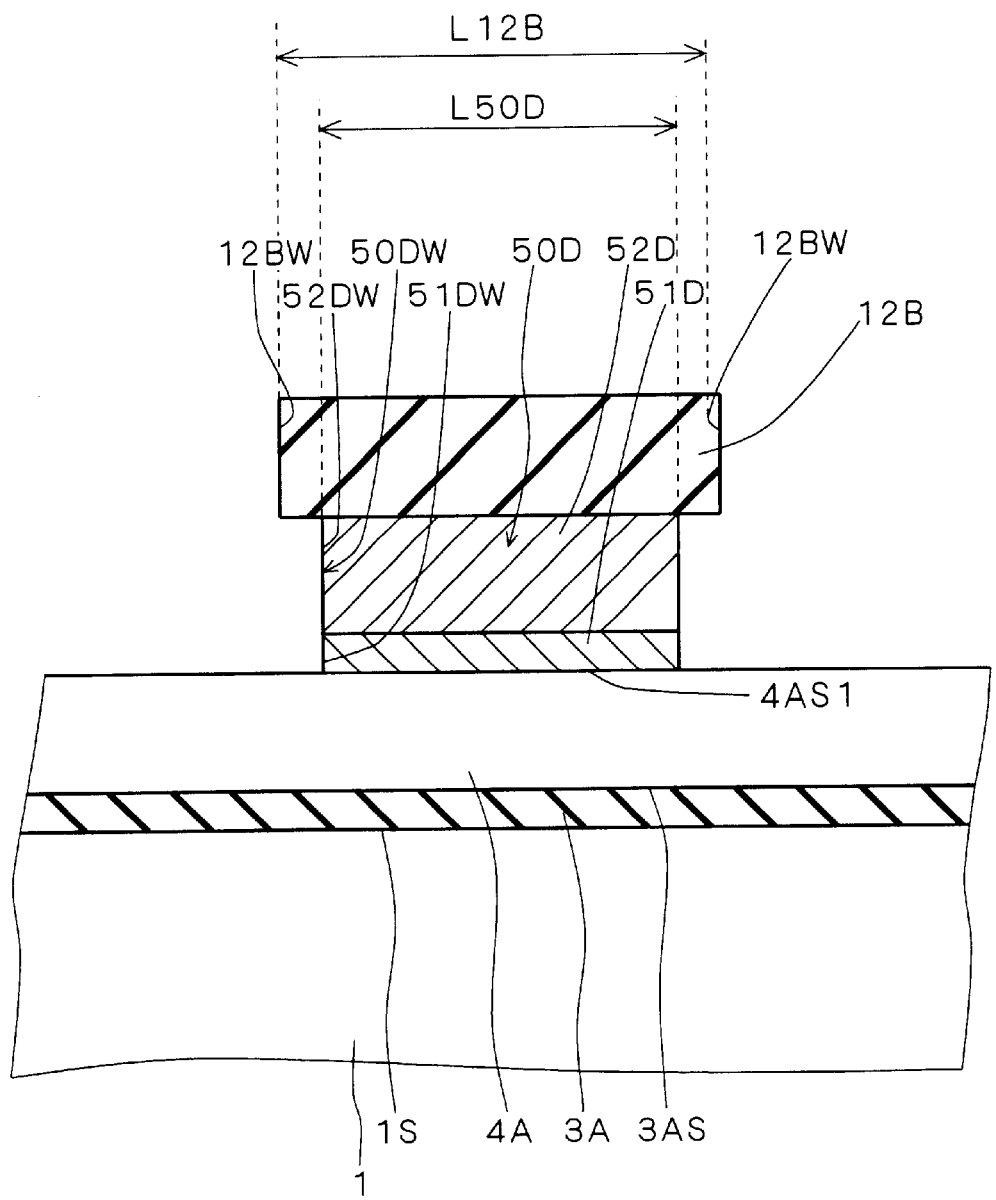
FIGS. 20 to 24 are schematic longitudinal sections used to explain a method of manufacturing the semiconductor device according to the second preferred embodiment.

Next, as shown in FIG. 20, a metal layer 50D (including first and second metal layers 51D and 52D) is formed by applying wet etching using a known chemical of acid or alkali to the metal layer 50B shown in FIG. 11. As can be seen by comparing FIG. 11 and FIG. 20, the wet etching causes the distance L50D between the side walls 50DW of the metal layer 50D (including the side walls 51DW and 52DW of the first and second metal layers 51D and 52D) to become shorter than the distance L50B between the side walls 50BW of the metal layer 50B.

Figure 21:
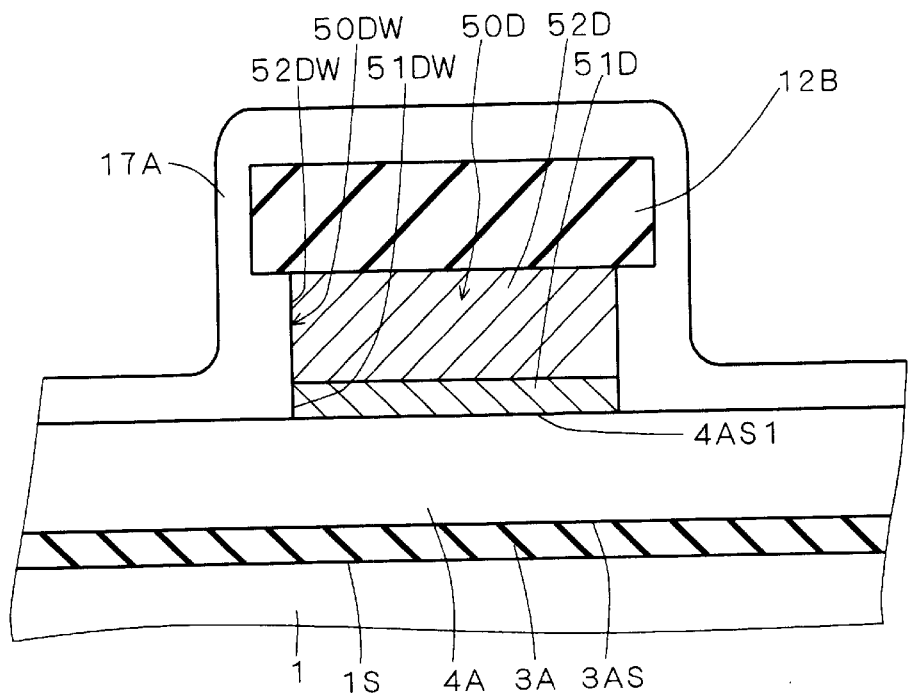
Figure 22:
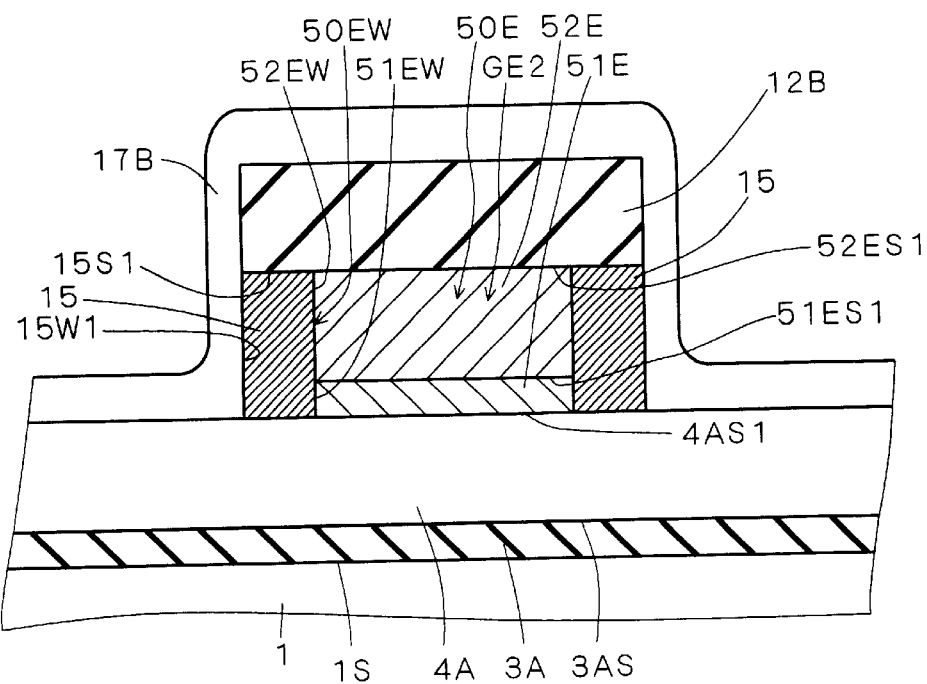
Figure 23:
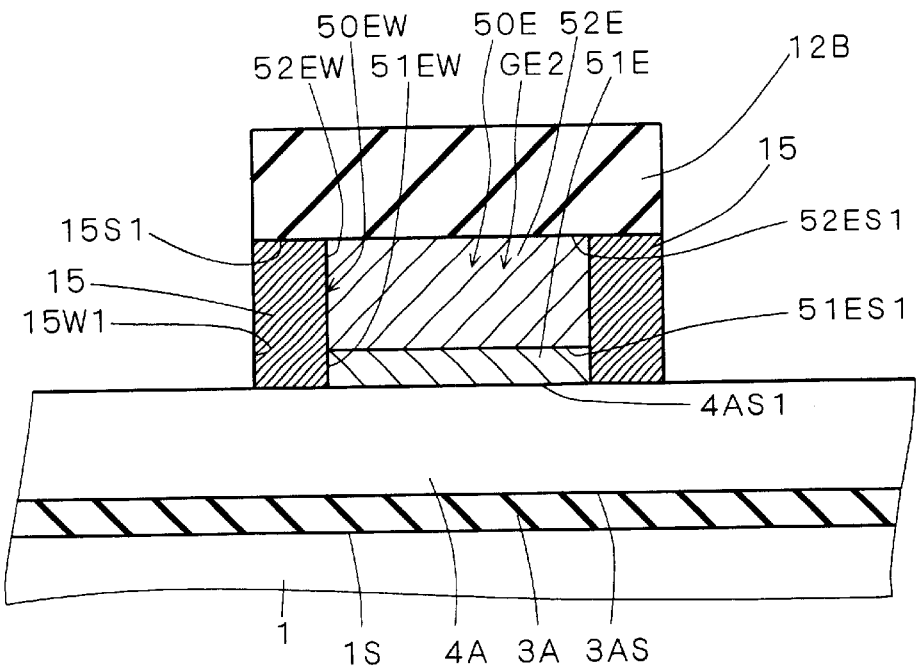

Subsequently, the manufacturing process steps of and after the step B1-7 are performed. That is to say, in the step B1-7 of forming the silicide films 15, the (poly)silicon layer 17A is formed in contact with the side walls 50DW of the metal layer 50D at least, as shown in FIG. 21. Next, annealing is applied to cause silicidation to occur between the metal layer 50D and the silicon film 17A to form the silicide films 15 shown in FIG. 22. Then the silicon film 17B remaining after the silicidation reaction is removed (see FIG. 23).

Figure 24:
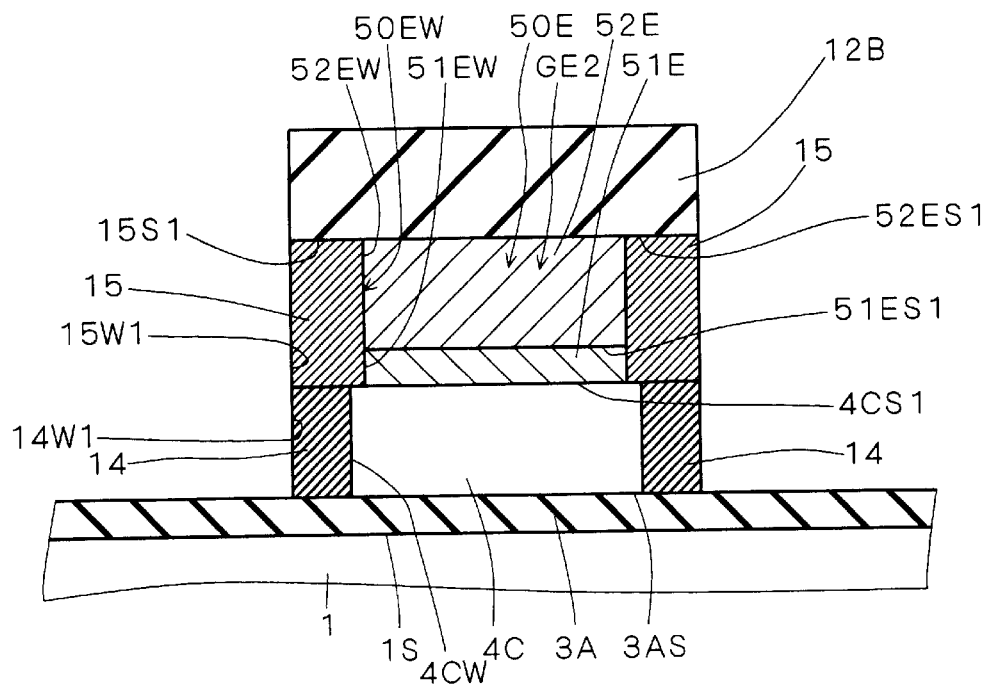

Next, the polysilicon layer 4A is patterned by anisotropic etching using the silicon nitride layer 12B as a hard mask (step B1-8) and reoxidation is performed (step B1-9) to form the polysilicon layer 4C and the silicon oxide films 14 as shown in FIG. 24. Even if the silicide films 15 have parts overhanging relative to the side walls 12BW of the silicon nitride layer 12B, the overhangs are etched in the step B1-8 and the distance L15 and the distance L12B become approximately equal as stated above. Then the source/drain extension regions 6, the spacers 7, and the source/drain regions 8 are formed (steps B1-10 to B1-12) to complete the MOS transistor 104 shown in FIG. 19.

The MOS transistor 104 has the following effects as well as the effects of the MOS transistors 101 to 103 of the first preferred embodiment. That is to say, when the distance L12B of the silicon nitride layer 12B is the same, the MOS transistor 104 can be downsized and integrated at higher degree than the MOS transistors 101 to 103, since the distance L14 and the distance L12B are approximately equal in the MOS transistor 104.

In this case, in consideration of the fact that the gate length of the MOS transistor is based on the distance L14 (which can be the largest among the distances L12B, L14, and L15), when the distance L12B of the silicon nitride layer 12B is the same, the gate length of the MOS transistor 104 can be shorter than those of the MOS transistors 101 to 103. Hence the channel resistance of the MOS transistor 104 can be smaller than those of the MOS transistors 101 to 103. Accordingly, the MOS transistor 104 can provide larger current driving capability than the MOS transistors 101 to 103.

When the current driving capability is set equal, that is, when the gate length is equal, the MOS transistor 104 enables further size reduction and higher degree of integration.

<Third Preferred Embodiment>

A3. Structure of Semiconductor Device

Figure 25:
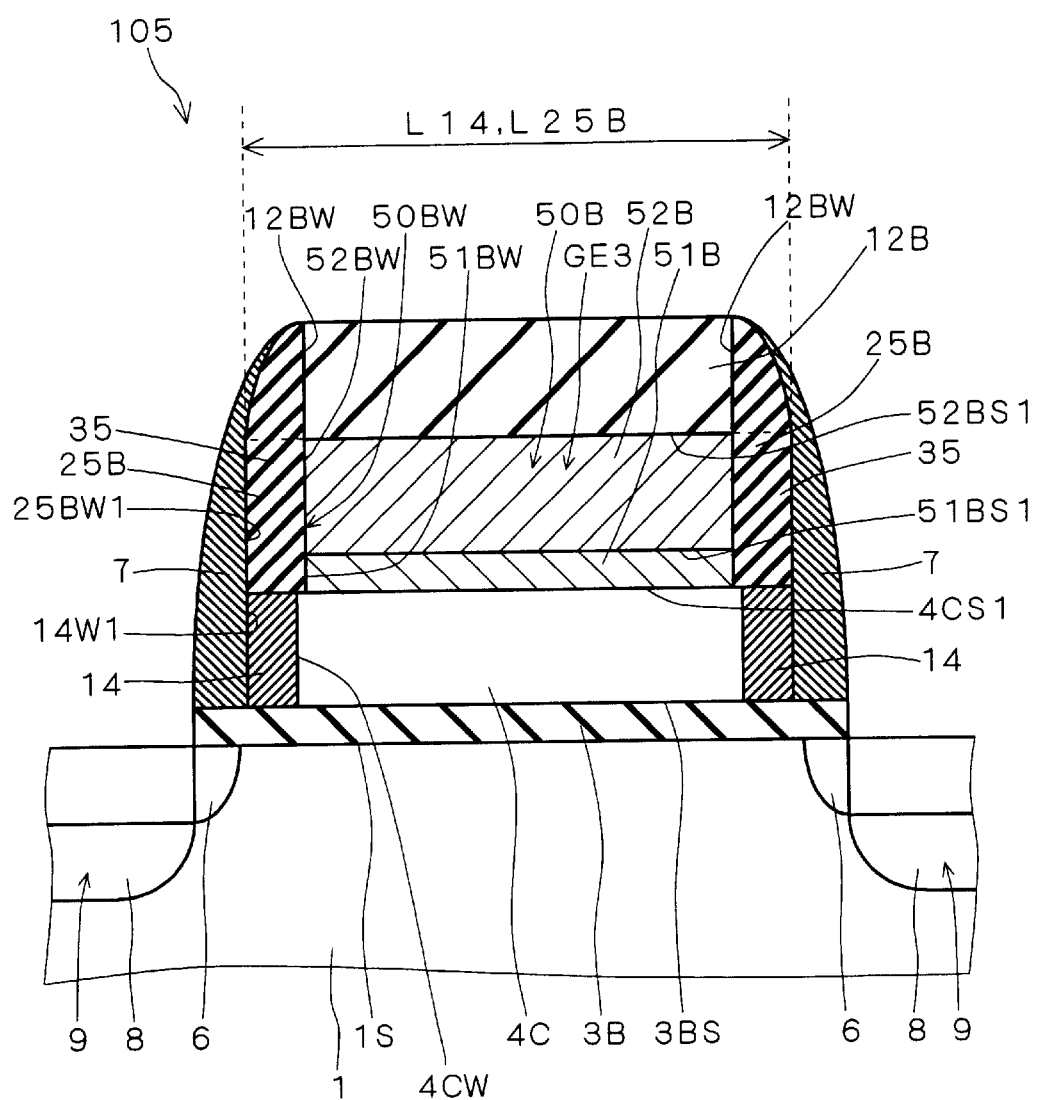
FIG. 25 is a schematic longitudinal section showing a semiconductor device according to a third preferred embodiment.

Next, an MOS transistor will be described as a semiconductor device 105 according to a third preferred embodiment. An example in which the MOS transistor 105 is a DRAM transistor will be described herein referring to FIGS. 25 and 26. FIG. 25 is a schematic longitudinal section of the MOS transistor 105 and FIG. 26 is an enlarged view showing a main part of the MOS transistor 105.

Figure 26:
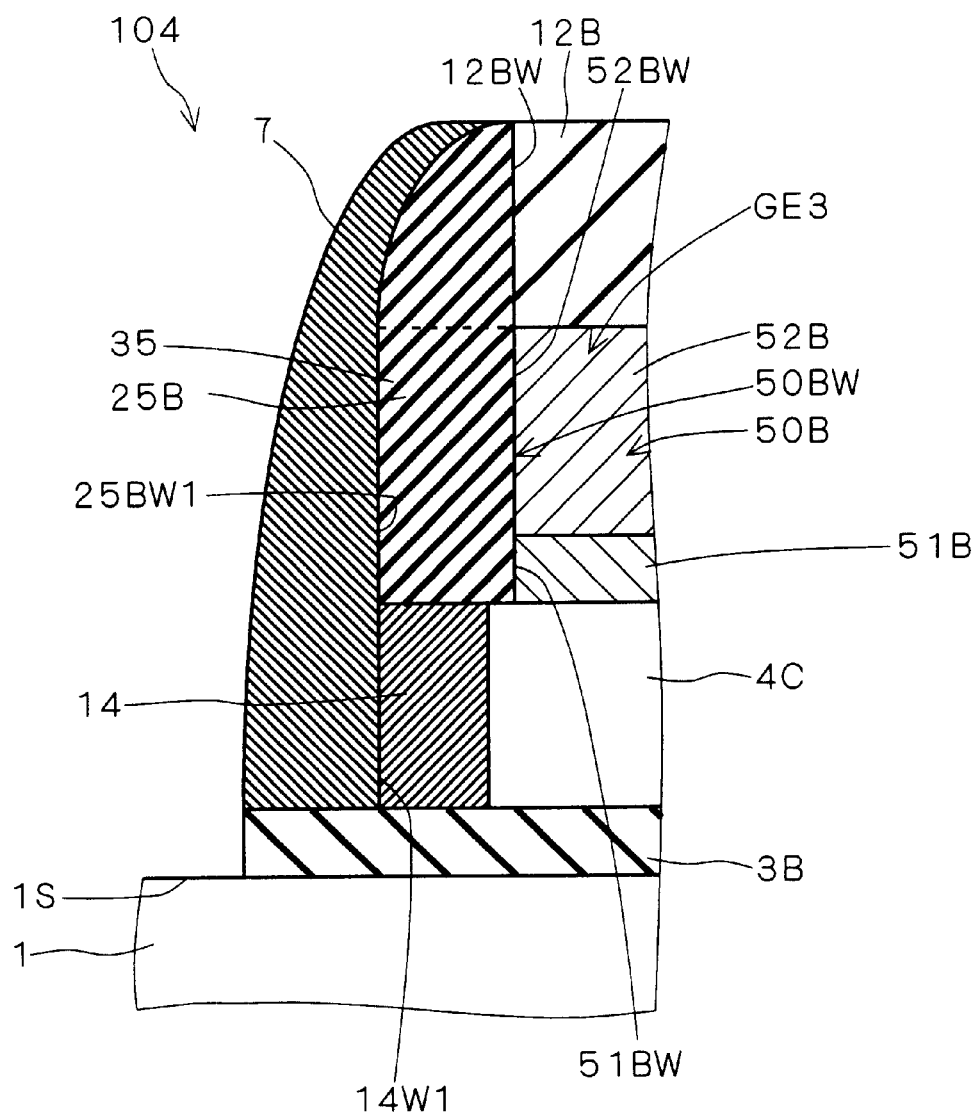
FIG. 26 is a schematic longitudinal section showing a main part of the semiconductor device according to the third preferred embodiment in an enlarged manner.

As shown in FIGS. 25 and 26, the MOS transistor 105 has the above-described metal layer 50B formed in contact with the main surface 4CS1 of the polysilicon layer 4C and the silicon nitride layer 12B formed on the main surface 52BS1 of the second metal layer 52B (or the metal layer 50B).

Particularly, in the MOS transistor 105, side wall spacers 25B are formed on the side walls 50BW of the metal layer 50B and on the side walls 12BW of the silicon nitride layer 12B. The surfaces or side walls 25BW1 of the spacers 25B on the opposite sides to the metal layer 50B are smoothly connected to the side walls 14W1 of the silicon oxide films 14. The distance L25B between the side walls 25BW1 of the two spacers 25B facing each other through the metal layer 50B is approximately equal to the distance L14 between the side walls 14W1 of the two silicon oxide films 14 facing each other through the polysilicon layer 4C. Like those in the MOS transistors 101 to 103, the side walls 25BW1 do not overhang towards the opposite sides to the metal layer 50B relative to the side walls 14W1 ((distance L25B)(distance L14)). The spacers 25B are made of a dielectric not containing oxygen, e.g. silicon nitride.

The structure including the polysilicon layer 4C, the silicon oxide films (silicon-containing films) 14, the metal layer 50B, and the parts (protective film) 35 of the spacers 25B which are located on the side walls 50BW of the metal layer 50B forms the gate electrode (conductive layer) GE3 of the MOS transistor 105.

The MOS transistor 105 also has the above-described side wall spacers 7 formed on the main surface 3BS of the gate insulating film 3B and in contact with the side walls 14W1 and 25BW1 of the silicon oxide films 14 and the spacers 25B.

B3. Method of Manufacturing the Semiconductor Device

Next, referring to FIGS. 25 and 26 and FIGS. 27 to 29, a method for manufacturing the MOS transistor 105 will be described. First, the semiconductor device shown in FIG. 11 is prepared by the manufacturing steps B1-1 to B1-6 described before.

B3-1. Formation of Side Wall Spacers as Protective Layer

Figure 27:
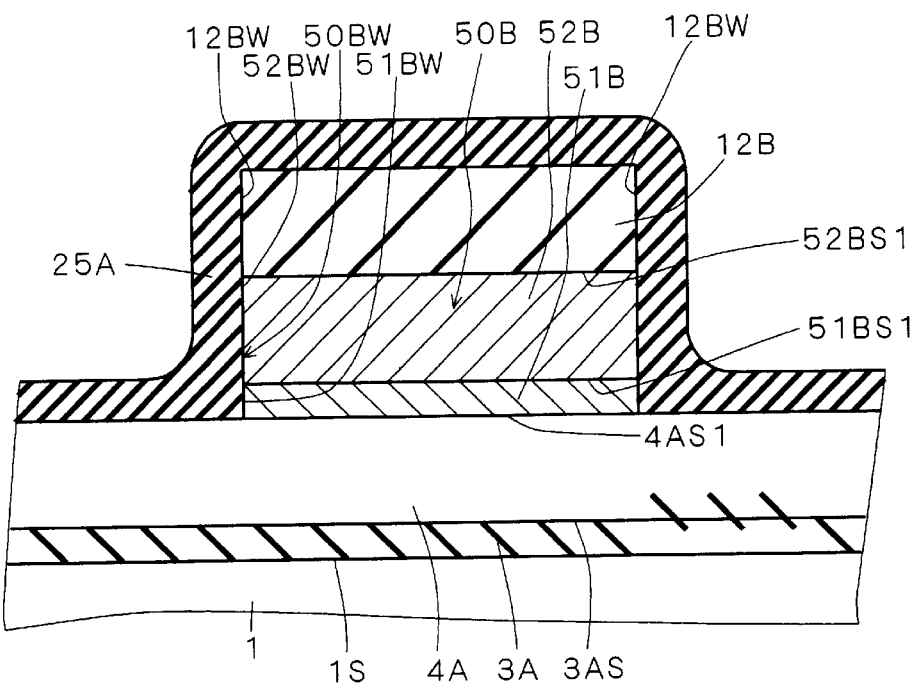
FIGS. 27 to 29 are schematic longitudinal sections used to explain a method of manufacturing the semiconductor device according to the third preferred embodiment.
Figure 28:
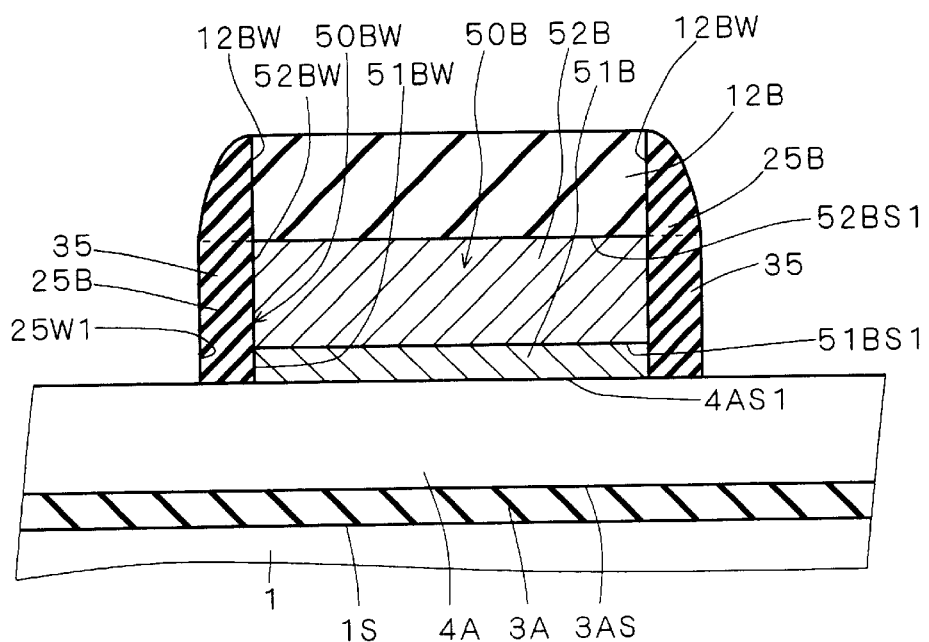

Next, as shown in FIG. 27, a dielectric layer not containing oxygen (a silicon nitride film is used herein) 25A is formed in contact with the side walls 50BW of the metal layer 50B and to cover the entirety of the main surface 1S of the silicon substrate 1. Then the silicon nitride film 25A is etched back to form the silicon nitride films 25B as shown in FIG. 28. In this process, the silicon nitride film is at least left on the side walls 50BW of the metal layer 50B (which corresponds to the parts 35). In this way, this step B3-1 corresponds to the step B1-7 already described in that the protective layers are formed on the side walls of the metal layer.

Figure 29:
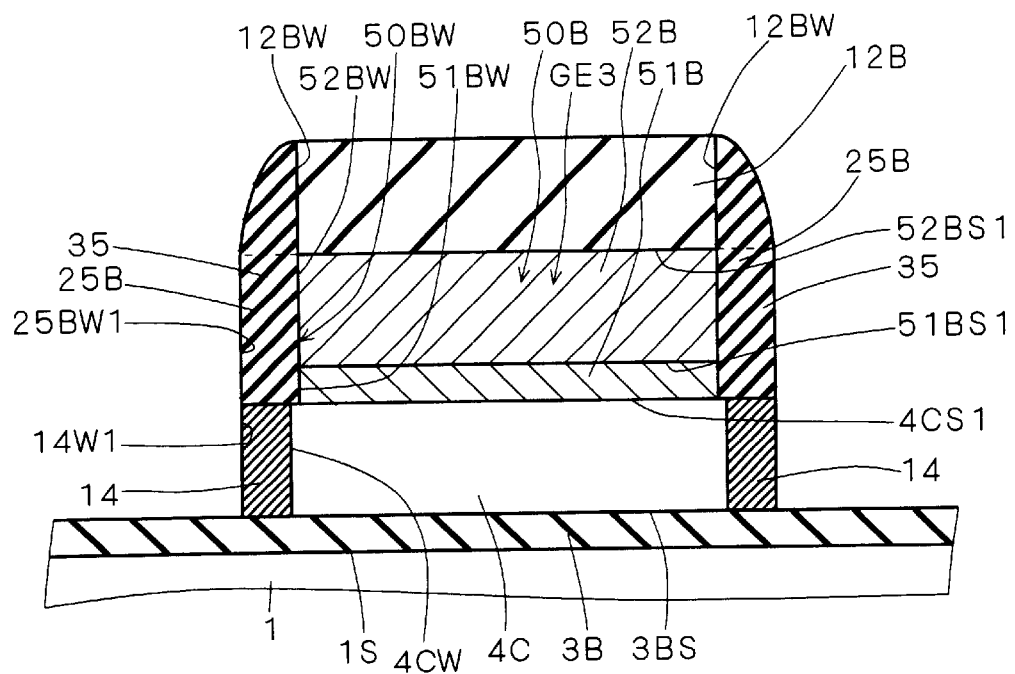
Figure 30:
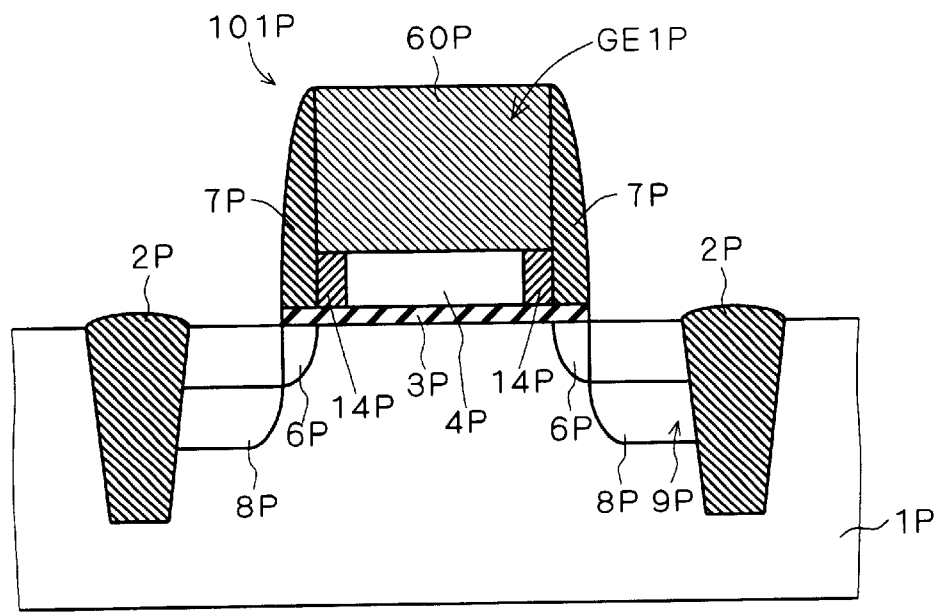
FIG. 30 is a schematic longitudinal section showing a first semiconductor device according to a conventional technique.

Subsequently, the manufacturing steps of and after the step B1-8 are performed. That is to say, the polysilicon layer 4A is patterned by anisotropic etching using the silicon nitride layer 12B and the spacers 25B as hard masks (step B1-8) and reoxidation is applied (step B1-9), thus forming the polysilicon layer 4C and the silicon oxide films 14 as shown in FIG. 29. Then the source/drain extension regions 6, the spacers 7, and the source/drain regions 8 are formed (the steps B1-10 to B1-12) to complete the MOS transistor 105 shown in FIG. 25.

According to the MOS transistor 105, the protective films 35 made of silicon nitride provide improved oxidation resistance and chemical resistance, as compared with the silicide films 15 used as the protective films in the MOS transistors 101 to 104. The protective films 35 do not contain oxygen, so that the metal layer 50 is never oxidized by the dielectric layers 35 in thermal processing performed after formation of the layers 35. Particularly, the effect of preventing the increase in the resistance can be more certainly obtained by forming the reoxidation films 14 and the like in such a manner that the ends of the reoxidation films 14 on the sides of the polysilicon layer 4C are out of contact with the metal layer 50B, as shown in FIG. 25 or 26.

Figure 31:
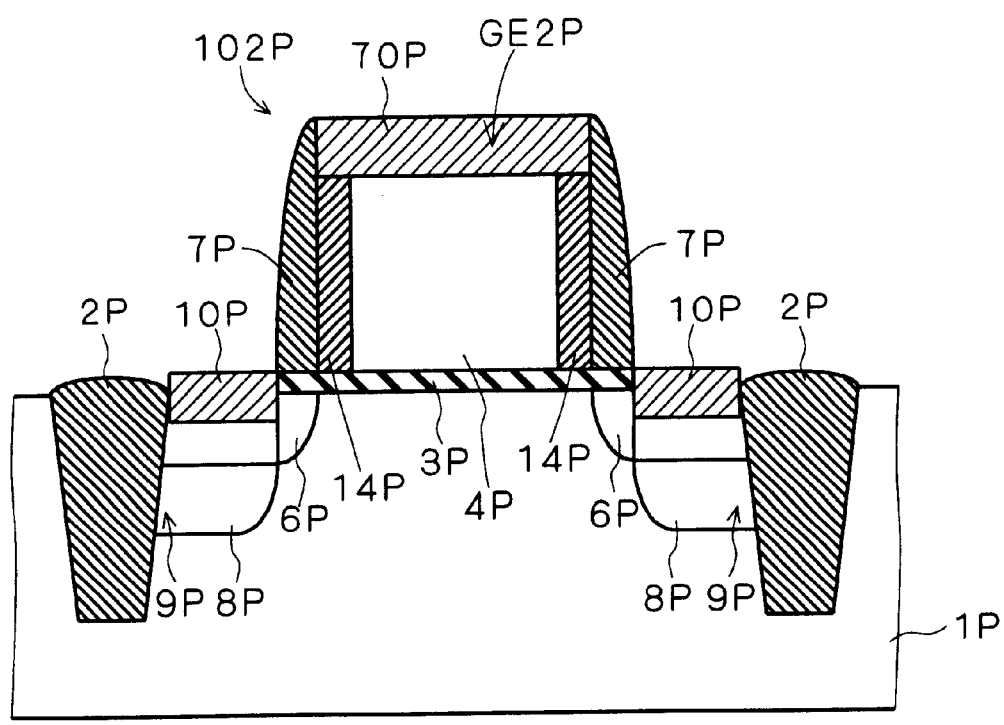
FIG. 31 is a schematic longitudinal section showing a second semiconductor device according to a conventional technique.
Figure 32:
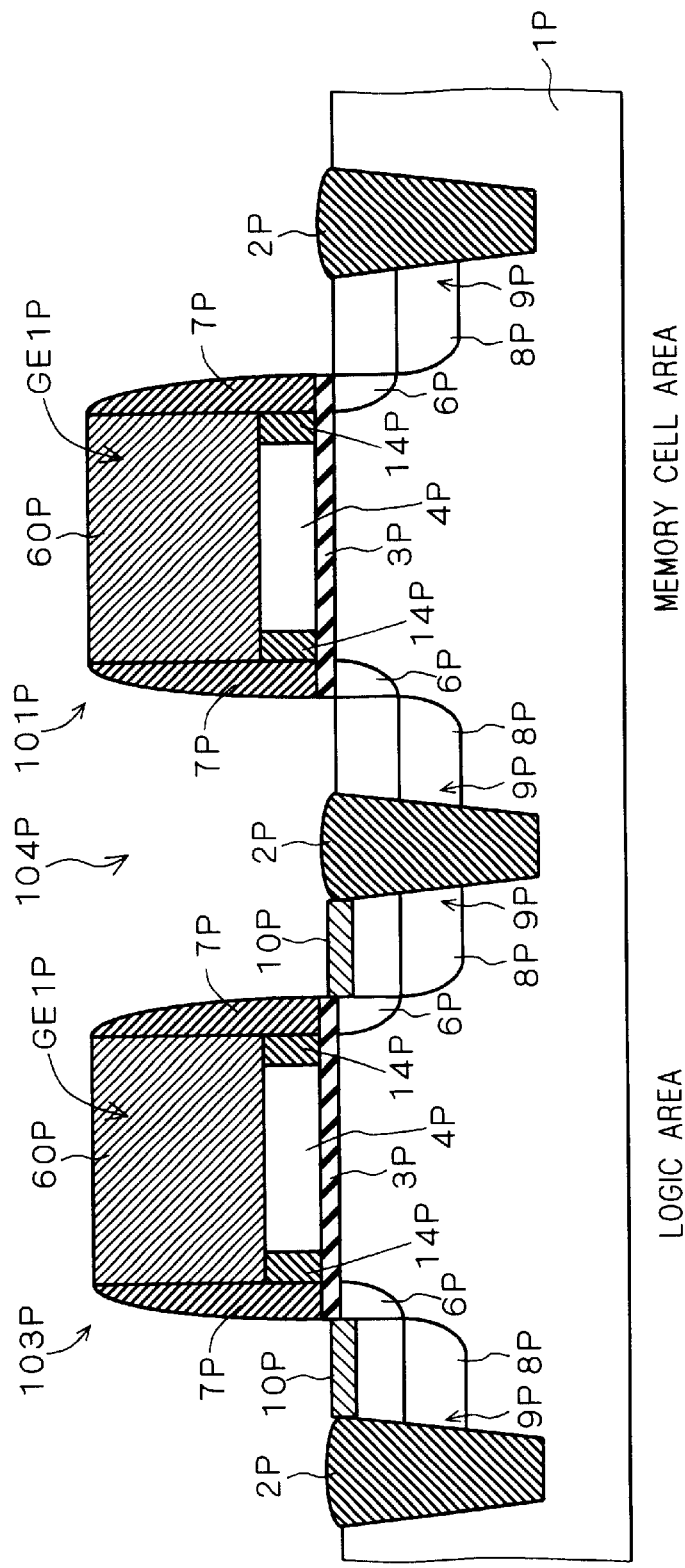
FIG. 32 is a schematic longitudinal section showing a third semiconductor device according to a conventional technique.

Japanese Patent Laying-Open No.7-335885 discloses a gate electrode having silicon nitride films formed on the side walls. However, the third prior art suggested in this reference is related to the stacked structure of a polysilicon layer and a silicide layer, that is, to a silicide gate similar to the gate electrode GE1P of the conventional MOS transistor 101P (see FIG. 31). Thus the gate electrode of the third prior art and the gate electrode GE3 composed of the polysilicon layer and the metal layer clearly differ in structure. Accordingly, the above-described gate electrode GE3(, GE1, GE2) has much lower gate resistance than the gate electrode of the third prior art. In the third prior art, part of the polysilicon layer is also etched when anisotropically etching the silicide layer. However, in consideration of the fact that it is difficult to ensure sufficient etching selectivity between silicide and polysilicon, controlling the etched amount of the polysilicon layer may be very difficult. In contrast, in the process of forming the gate electrode GE3(, GE1, GE2), the polysilicon layer 4A is not etched when etching the metal layer 50A.

The gate electrodes GE1, GE2, and GE3 have the reoxidation films (silicon-containing layers) 14 in the examples described above. However, a gate electrode in which the silicon oxide films 14 are not formed and the parts of the oxide films 14 are also made of silicon, in other words, a gate electrode in which both of the metal layer and the silicide films (protective layers) on its side walls are formed on the (poly)silicon layer, can be applied to the MOS transistor. In this case, regions of an arbitrary thickness from the side walls of the silicon layer correspond to the "silicon-containing layers." Other dielectric such as silicon nitride film can be applied to the "silicon-containing layer" in place of the reoxidation film.

Applications of the gate electrodes GE1, GE2, and GE3 are not limited to the MOS transistors. It is clear that the applications include MIS transistors in which the gate insulating film is made of dielectric (insulator) like silicon nitride film. Further, needless to say, the structures of the gate electrodes GE1, GE2, and GE3 can be applied also to various electrodes and interconnections made of the stacked structure of metal layer/silicon layer (they can generically be referred to as "conductive layers").

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a silicon layer;

a silicon-containing layer which is located on a side wall of said silicon layer;

a metal layer in contact with a main surface of said silicon layer; and a protective layer provided on a side wall of said metal layer and having a side wall smoothly connected to a side wall of said silicon-containing layer on the opposite side to said silicon layer, wherein said metal layer and said protective layer are comprised of different materials; and wherein said silicon layer, said metal layer and said protective layer constitute a conductive layer.

2. The semiconductor device according to claim 1, wherein said side wall of said protective layer does not overhang relative to said side wall of said silicon-containing layer.

3. The semiconductor device according to claim 1, wherein said protective layer is made of a silicide.

4. The semiconductor device according to claim 1, wherein said protective layer is made of a dielectric which does not contain oxygen.

5. The semiconductor device according to claim 4, wherein said dielectric which does not contain oxygen is silicon nitride.

6. The semiconductor device according to claim 1, wherein said silicon-containing layer is out of contact with said metal layer.

7. The semiconductor device according to claim 1, wherein said metal layer at least comprises a barrier metal layer in contact with said silicon layer.

8. The semiconductor device according to claim 1, wherein said conductive layer forms a gate electrode of an MIS transistor.

9. A semiconductor device as recited in claim 1, comprising:

a first layer having a first width and comprised of said silicon layer, said silicon layer having opposing side walls, and said silicon-containing layer located on each of said side walls of said silicon layer; and a second layer having a second width and comprising said metal layer, said metal layer having opposing side surfaces, and a protective layer provided on each of said side surfaces of said metal layer, wherein said a first width is substantially equal to said second width.

* * * * *